(12) United States Patent
Inoue et al.

(10) Patent No.: US 9,521,491 B2
(45) Date of Patent: Dec. 13, 2016

(54) CAPACITIVE SENSOR, ACOUSTIC SENSOR AND MICROPHONE

(71) Applicant: OMRON Corporation, Kyoto-shi, Kyoto (JP)

(72) Inventors: Tadashi Inoue, Kyoto (JP); Takashi Kasai, Kyoto (JP); Yuki Uchida, Kyoto (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 14/773,451

(22) PCT Filed: Sep. 9, 2013

(86) PCT No.: PCT/JP2013/074209
§ 371 (c)(1),
(2) Date: Sep. 8, 2015

(87) PCT Pub. No.: WO2014/141507
PCT Pub. Date: Sep. 18, 2014

(65) Prior Publication Data
US 2016/0021459 A1    Jan. 21, 2016

(30) Foreign Application Priority Data
Mar. 14, 2013 (JP) ................. 2013-052538

(51) Int. Cl.
| | |
|---|---|
| *H04R 7/18* | (2006.01) |
| *H04R 19/00* | (2006.01) |
| *H04R 19/04* | (2006.01) |
| *B81B 7/00* | (2006.01) |

(52) U.S. Cl.
CPC .............. *H04R 7/18* (2013.01); *B81B 7/0006* (2013.01); *H04R 19/005* (2013.01); *H04R 19/04* (2013.01); *B81B 2201/0257* (2013.01); *B81B 2203/0127* (2013.01); *B81B 2203/0307* (2013.01); *B81B 2207/07* (2013.01); *H04R 2410/03* (2013.01)

(58) Field of Classification Search
CPC ....... H04R 7/18; H04R 7/0006; H04R 19/005; H04R 19/04; H04R 2410/03; B81B 7/006; B81B 2201/0257; B81B 2203/0127; B81B 2203/0307; B81B 2207/07
See application file for complete search history.

(56) References Cited

U.S. PATENT DOCUMENTS

| | | | |
|---|---|---|---|
| 2008/0232615 A1* | 9/2008 | Song | ............ H04R 19/005 381/174 |
| 2009/0190782 A1 | 7/2009 | Suzuki et al. | |
| 2010/0158279 A1 | 6/2010 | Conti et al. | |
| 2012/0033831 A1 | 2/2012 | Leitner | |

\* cited by examiner

*Primary Examiner* — Sonia Gay
(74) *Attorney, Agent, or Firm* — Mots Law, PLLC

(57) ABSTRACT

A diaphragm is arranged on the upper surface of a silicon substrate so as to cover a chamber in the silicon substrate. Multiple anchors are provided on the upper surface of the silicon substrate, and the lower surfaces of corner portions of the diaphragm are supported by the anchors. Also, a fixed electrode plate is provided above the diaphragm with an air gap therebetween. In a view from a direction perpendicular to the upper surface of the silicon substrate, the entire length of the outer edge of the diaphragm located between adjacent anchors is located outward of a line segment that circumscribes the edges of the adjacent anchors on the side distant from the center of the diaphragm. Also, one or two or more through-holes are formed in the diaphragm in the vicinity of the anchors.

20 Claims, 20 Drawing Sheets

FIG. 4
(A)
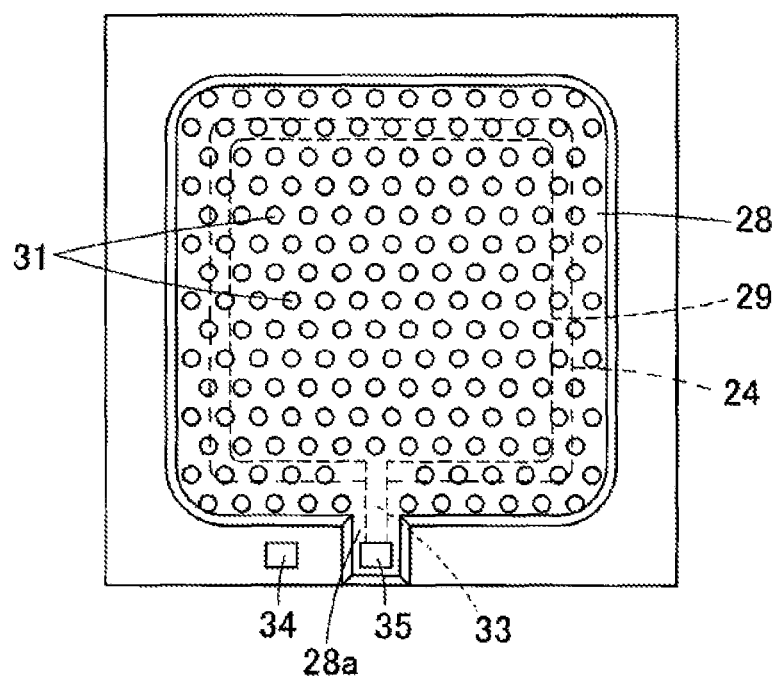
(B)
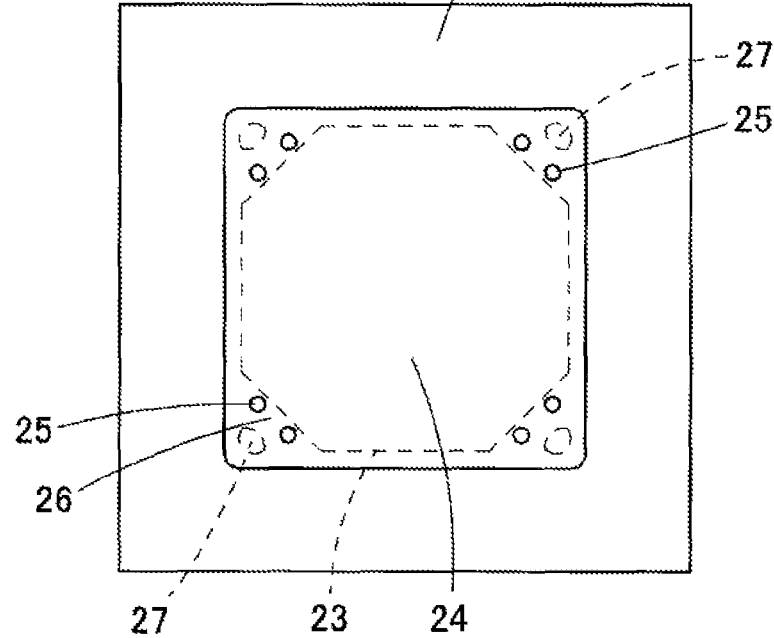

FIG. 13
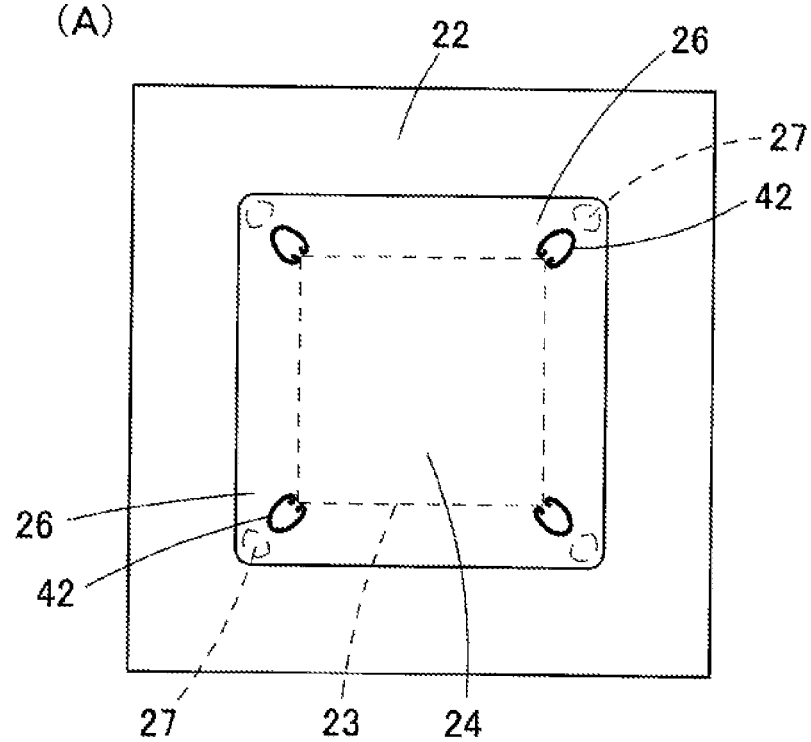
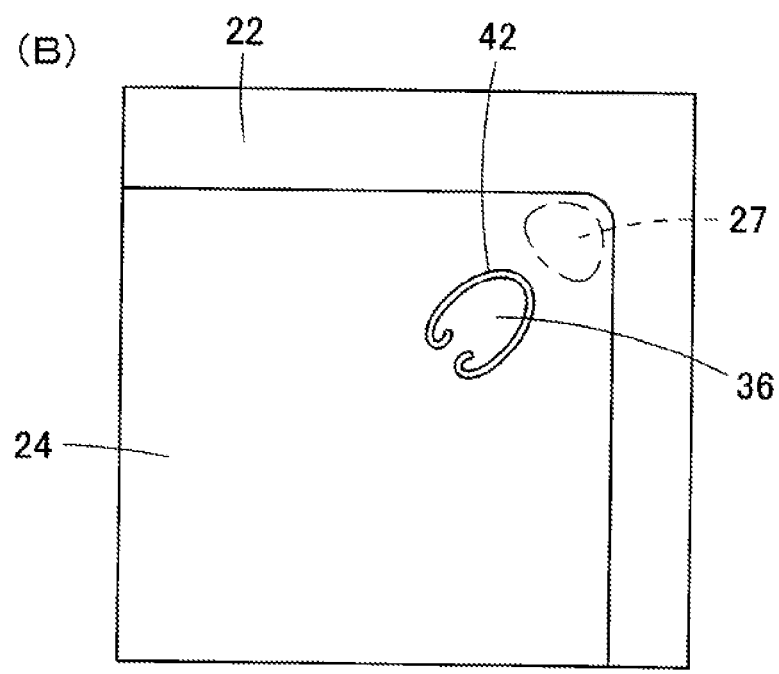

FIG. 16
(A)
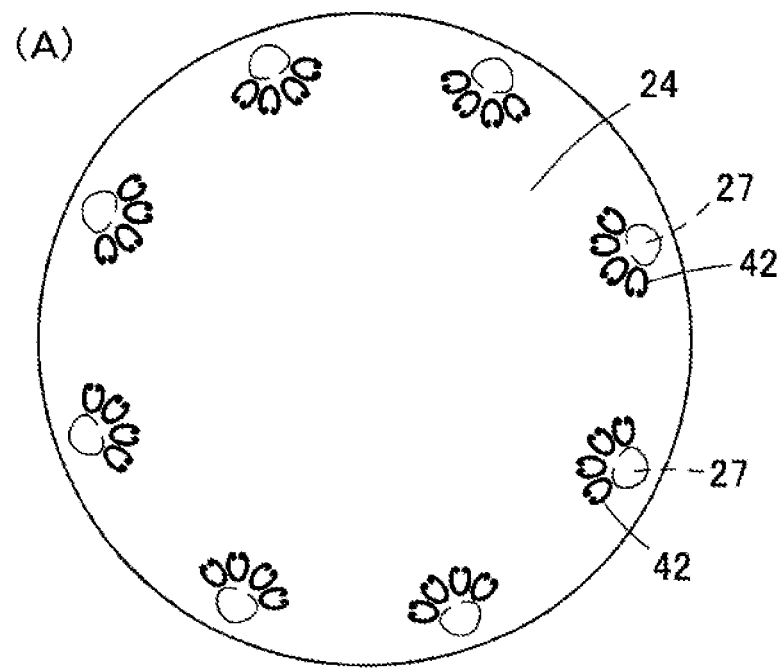
(B)
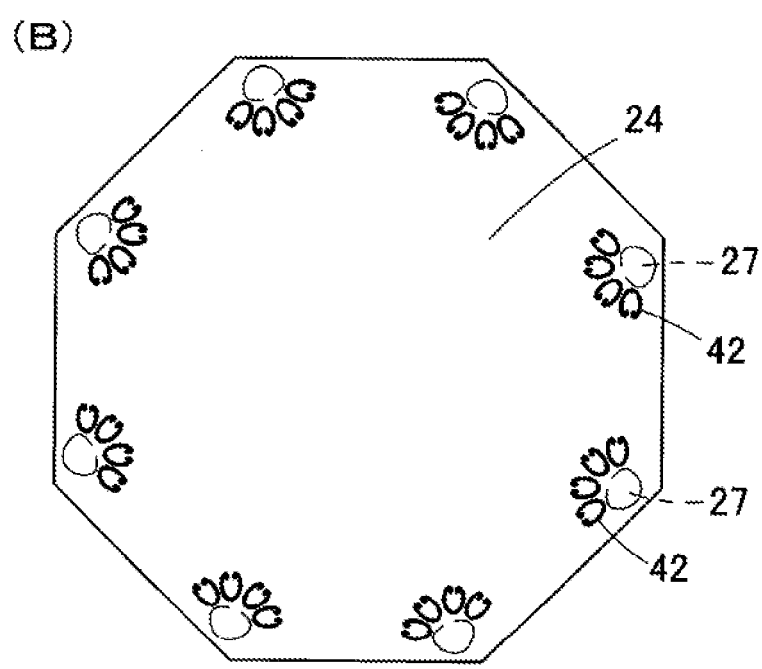

CAPACITIVE SENSOR, ACOUSTIC SENSOR AND MICROPHONE

TECHNICAL FIELD

The present invention relates to a capacitive sensor, an acoustic sensor, and a microphone. Specifically, the present invention relates to a capacitive sensor constituted by a capacitor structure that is made up of a vibrating electrode plate (diaphragm) and a fixed electrode plate. The present invention also relates to an acoustic sensor (acoustic transducer) that converts acoustic vibration into an electrical signal and outputs it, and a microphone that uses the acoustic sensor.

RELATED ART

FIG. 1 is a plan view showing the shape of a diaphragm used in a conventional acoustic sensor. The acoustic sensor in FIG. 1 does not have leg pieces for supporting a diaphragm 12, and the lower surface of the corner portions of the diaphragm 12 are supported by anchors 14 on the upper surface of a substrate 11.

However, with the diaphragm support structure shown in FIG. 1, when the diaphragm receives acoustic vibration, the amount of displacement is small due to the high rigidity of the diaphragm in the vicinity of the anchors, and it is difficult to produce a highly sensitive acoustic sensor.

Also, with the acoustic sensor (microphone) disclosed in Patent Document 1, the entire periphery of the lower surface of the outer peripheral portion of the diaphragm is fixed to the upper surface of the substrate, and small holes are formed in the diaphragm along the inner side of the fixed portion. However, in this acoustic sensor as well, when the diaphragm receives acoustic vibration, the amount of displacement is small due to the entire periphery of the diaphragm being fixed, and it is difficult to produce a highly sensitive acoustic sensor.

For this reason, in order to increase the amount of displacement of the diaphragm and raise the sensitivity, an acoustic sensor has been proposed in which leg pieces (beams) extend outward from the diaphragm, and the ends of the leg pieces are supported by anchors. Examples of this type of acoustic sensor are disclosed in Patent Document 2 and Patent Document 3, for example.

FIG. 2(A) is a schematic plan view of an acoustic sensor in which leg pieces provided on a diaphragm are supported by anchors. Note that the back plate and the fixed electrode plate have been removed to expose the diaphragm in FIG. 2(A).

In the acoustic sensor shown in FIG. 2(A), a rectangular diaphragm 12 is arranged on the upper surface of a substrate 11 so as to cover a chamber (not shown) formed in the substrate 11. Leg pieces 13 extend diagonally outward from the corner portions of the diaphragm 12. Four anchors 14 are provided on the upper surface of the substrate 11 at the edges of the chamber, and the lower surfaces of tip portions of the leg pieces 13 are respectively supported by the anchors 14. Accordingly, the diaphragm 12 is supported by the leg pieces 13 that have low rigidity on the upper surface of the substrate 11, thus having a structure that undergoes a large amount of vertical displacement due to acoustic vibration.

However, in the case of a structure in which the leg pieces 13 extend outward from the diaphragm 12 as in FIG. 2(A), the diaphragm 12 does not exist in the region between one leg piece 13 and another leg piece 13, that is to say the region that is hatched in FIG. 2(B), and this region is not effectively utilized. For this reason, the area of the substrate is larger than the area of the diaphragm, and this has been an obstructing factor when reducing the size of the acoustic sensor. Alternatively, the area of the diaphragm is smaller with respect to the same substrate size, and thus the sensitivity of the acoustic sensor decreases.

If an attempt is made to increase the area of the diaphragm 12 with the support structure shown in FIG. 2(A), it is conceivable to extend the diaphragm 12 into the region between one leg piece 13 and another leg piece 13 as shown in FIG. 3, for example. However, with the diaphragm 12 shown in FIG. 3, portions 12a that extend into the region between one leg piece 13 and another leg piece 13 are supported in a cantilevered manner by the portion supported by the leg pieces 13 (the portion that was originally the diaphragm 12 in FIG. 2(A)). For this reason, the extension portions 12a are easily influenced by unique warping of the diaphragm 12, and easily become warped upward or downward. The direction and extent of this warping vary due to variation in the production process, and therefore diaphragms having the structure in FIG. 3 become factors that cause variation in acoustic sensor sensitivity and the like. Also, depending on the case, there is a risk of a warped portion 12a colliding with the substrate 11 or the back plate.

Also, the area of the diaphragm 12 can be increased by shortening the length of the leg pieces 13. However, if the length of the leg pieces 13 is shortened, the rigidity of the leg pieces 13 increases, and therefore the amount of displacement of the diaphragm 12 decreases, and the sensitivity of the acoustic sensor decreases.

RELATED ART DOCUMENTS

Patent Documents

Patent Document 1: US Patent Application No. 2012/0033831, Specification (US 2012/0033831A1)

Patent Document 2: US Patent Application No. 2010/0158279, Specification (US 2010/0158279A1)

Patent Document 3: US Patent Application No. 2009/0190782, Specification (US 2009/0190782A1)

SUMMARY OF THE INVENTION

Problem to be Solved by the Invention

An object of the present invention is to provide a capacitive sensor such as an acoustic sensor that makes it possible to improve the sensitivity while also reducing the sensor size.

Means for Solving the Problems

A capacitance sensor according to the present invention includes: a substrate having a cavity that is open at least at an upper surface; a vibrating electrode plate formed above the substrate so as to cover an upper portion of the cavity; a plurality of anchors that are arranged with a gap in an outer peripheral portion of the vibrating electrode plate and enable the vibrating electrode plate to be fixed to a stationary member; and a fixed electrode plate arranged so as to oppose the vibrating electrode plate, wherein in a view from a direction perpendicular to an upper surface of the substrate, an entire length of an outer edge of the vibrating electrode plate located between adjacent anchors is located outward of a tangent that circumscribes edges of the adjacent anchors on a side distant from a center of the vibrating electrode plate, and one or two or more openings are provided in regions of the vibrating electrode plate that are in a vicinity of the anchors.

Here, the openings are openings surrounded by the diaphragm, such as slits or through-holes that penetrate vertically, and do not include notches. Also, in the view from the direction perpendicular to the upper surface of the substrate, the entire length of the outer edge of the vibrating electrode plate located between adjacent anchors is located outward of the tangent that circumscribes the edges of the adjacent anchors on the side distant from the center of the vibrating electrode plate, and this means that the outer edge of the vibrating electrode plate located between adjacent anchors is not located inward of the tangent that circumscribes the edges of the adjacent anchors on the side distant from the center of the vibrating electrode plate, and the outer edge of the vibrating electrode plate does not intersect this tangent. Note that closed openings such as through-holes or slits that are provided on the inner side of the vibrating electrode plate may abut or intersect the tangent. Also, it is sufficient that a position in the vicinity of an anchor is a position separated from the position of the anchor by an amount equal to or twice the size of the anchor.

In the capacitive sensor of the present invention, the vibrating electrode plate can be expanded into the region between anchors without allowing the edges of the vibrating electrode plate to become loose, thus making it possible to increase the area of the vibrating electrode plate and making it possible to improve the sensitivity of the sensor. Also, because openings are provided in the vibrating electrode plate in the vicinity of the anchors, it is possible to reduce the rigidity of the support portion of the vibrating electrode plate caused by the anchors, it is possible to increase the amount of displacement of the vibrating electrode plate, and it is possible to improve the sensitivity of the sensor. Meanwhile, leg pieces for supporting the vibrating electrode plate do not extend outward as in conventional sensors, and therefore the size of the sensor can be reduced. Accordingly, the capacitive sensor of the present invention makes it possible to produce a capacitive sensor that has a high sensitivity and a small size.

In an embodiment of the capacitive sensor according to the present invention, a portion of an outer peripheral edge of each of the openings that has a longest perpendicular distance from a line segment that connects an anchor in a vicinity of the opening and a center of the vibrating electrode plate is curved. Stress easily becomes concentrated at the place that has the longest perpendicular distance from the line segment that connects the anchor and the center of the vibrating electrode plate, and the concentration of stress can be alleviated if this portion is curved.

In another embodiment of the capacitive sensor according to the present invention, the openings are slits shaped as an open ring. According to this embodiment, the regions surrounded by the slits are blocked by a portion of the diaphragm, thus making it possible to prevent a reduction in sensitivity to low frequency sound.

In yet another embodiment of the capacitive sensor according to the present invention, the slits are interrupted on a central side of the vibrating electrode plate. According to this embodiment, the regions surrounded by the slits become displaced along with the central portion of the vibrating electrode plate, thus contributing to change in the capacitance, and making it possible to improve the sensitivity of the sensor.

Also, it is preferable that a gap between ends of each of the slits in an interrupted portion of the slit is smaller than a longest perpendicular distance from a line segment that connects an anchor in a vicinity of the slit and a center of the vibrating electrode plate to an outer peripheral edge of the slit.

In yet another embodiment of the capacitive sensor according to the present invention, an end portion of each of the slits is curved toward an interior of a region surrounded by the slit. According to this embodiment, it is possible to alleviate the concentration of stress in the tip portions of the slits 42, and it is possible to increase the strength of the vibrating electrode plate.

In yet another embodiment of the capacitive sensor according to the present invention, in the view from the direction perpendicular to the upper surface of the substrate, the opening has a shape symmetrical with respect to a straight line connecting the anchor and a center of the vibrating electrode plate. According to this embodiment, it is possible to prevent stress from being generated unevenly on the two sides of an opening.

Also, a plurality of openings provided in a region in a vicinity of one anchor may be arranged in a periphery of the one anchor.

In yet another embodiment of the capacitive sensor according to the present invention, the openings in the vibrating electrode plate are provided at locations that are not overlapped with the cavity in the view from the direction perpendicular to the upper surface of the substrate. According to this embodiment, it is possible to prevent the acoustic resistance between the vibrating electrode plate and the substrate upper surface from being too small, and sensitivity to low-pitch sound decreasing.

Also, in the capacitive sensor according to the present invention, the stationary member may be the substrate, and the vibrating electrode plate may be fixed above the substrate via the anchors. Here, the vibrating electrode plate may be fixed on the substrate via anchors, or may be fixed on an insulating film or a protective film provided on the upper surface of the substrate. Alternatively, in the case where a back plate is formed above the substrate so as to cover the vibrating electrode plate, the stationary member may be the back plate, and the vibrating electrode plate may be able to be fixed to a lower surface of the back plate via anchors. Also, a configuration is possible in which the stationary member is the fixed electrode plate, and the vibrating electrode plate is fixed to the fixed electrode plate via anchors.

Among these cases, in the case in which the vibrating electrode plate is fixed to the upper surface of the substrate via anchors, the vibrating electrode plate and the substrate may be electrically conductive by a conductive portion that penetrates an interior of an anchor. According to this embodiment, there is no need to extend a lead-out interconnect from the vibrating electrode plate and draw a line, thus making it possible to reduce the sensor size.

An acoustic sensor according to the present invention is an acoustic sensor employing a capacitive sensor according to the present invention, a plurality of acoustic holes for allowing passage of acoustic vibration is formed in the back plate and the fixed electrode plate. With the acoustic sensor according to the present invention, it is possible to produce an acoustic sensor that has high sensitivity to sound and has a small sensor size.

In an embodiment of the acoustic sensor according to the present invention, the acoustic holes located above the openings have a smaller opening area than the acoustic holes located in a central portion of the back plate. According to this embodiment, it is difficult for air to pass from the openings through the acoustic holes, and it possible to prevent a reduction in sensitivity in the low-pitch range.

A microphone according to the present invention includes an acoustic sensor of the present invention and a circuit portion that amplifies a signal from the acoustic sensor and outputs the amplified signal to the outside. According to this microphone, sensitivity is raised, and a reduction in size is also made possible.

Note that the solution to the problems in the present invention features an appropriate combination of the above-described constituent elements, and many variations of the present invention are possible according to the combination of the constituent elements.

BRIEF DESCRIPTION OF THE DRAWINGS

FIG. 4(A) is a plan view showing an acoustic sensor according to Embodiment 1 of the present invention. FIG. 4(B) is a plan view showing the acoustic sensor shown in FIG. 4(A), in a state in which a back plate and a fixed electrode plate have been removed to expose a diaphragm.

FIG. 13(A) is a plan view of a diaphragm in Embodiment 3 of the present invention.

FIG. 13(B) is an enlarged view of a corner portion of the diaphragm shown in FIG. 13(A).

FIG. 16(A) is a plan view of a diaphragm in yet another modified example of Embodiment 3. FIG. 16(B) is a plan view of a diaphragm in yet another modified example of Embodiment 3.

Figure 1:
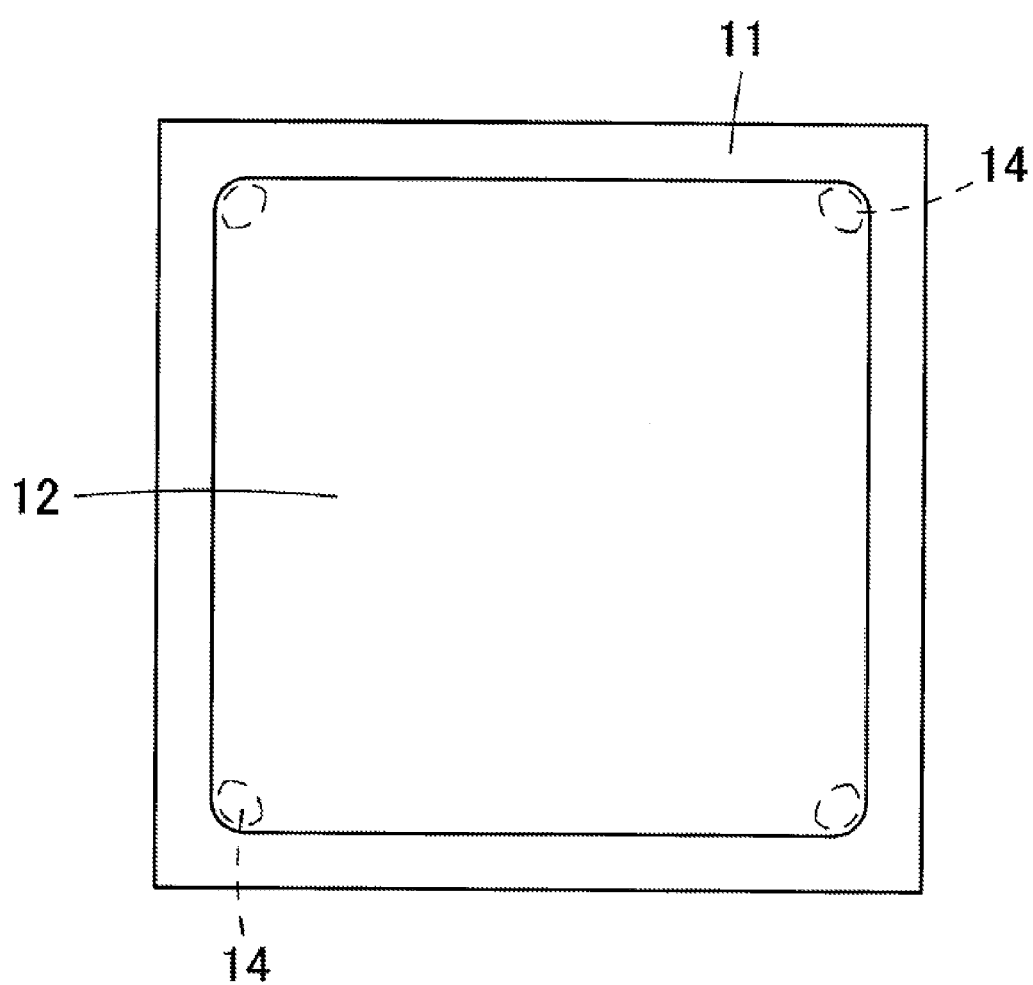
FIG. 1 is a plan view of a conventional acoustic sensor that does not have leg pieces, in a state in which a back plate and a fixed electrode plate have been removed.

INDEX TO THE REFERENCE NUMERALS 21, 41, 51, 61, 71 Acoustic sensor
22 Silicon substrate
23 Chamber
24 Diaphragm
25 Through-hole
27 Anchor
27a Through-hole
28 Back plate
29 Fixed electrode plate
42 Slit

EMBODIMENTS OF THE INVENTION

Hereinafter, preferred embodiments of the present invention will be described with reference to the accompanying drawings. Note that the present invention is not limited to the following embodiments, and various design modifications can be made without departing from the gist of the present invention.

Embodiment 1

Figure 5:
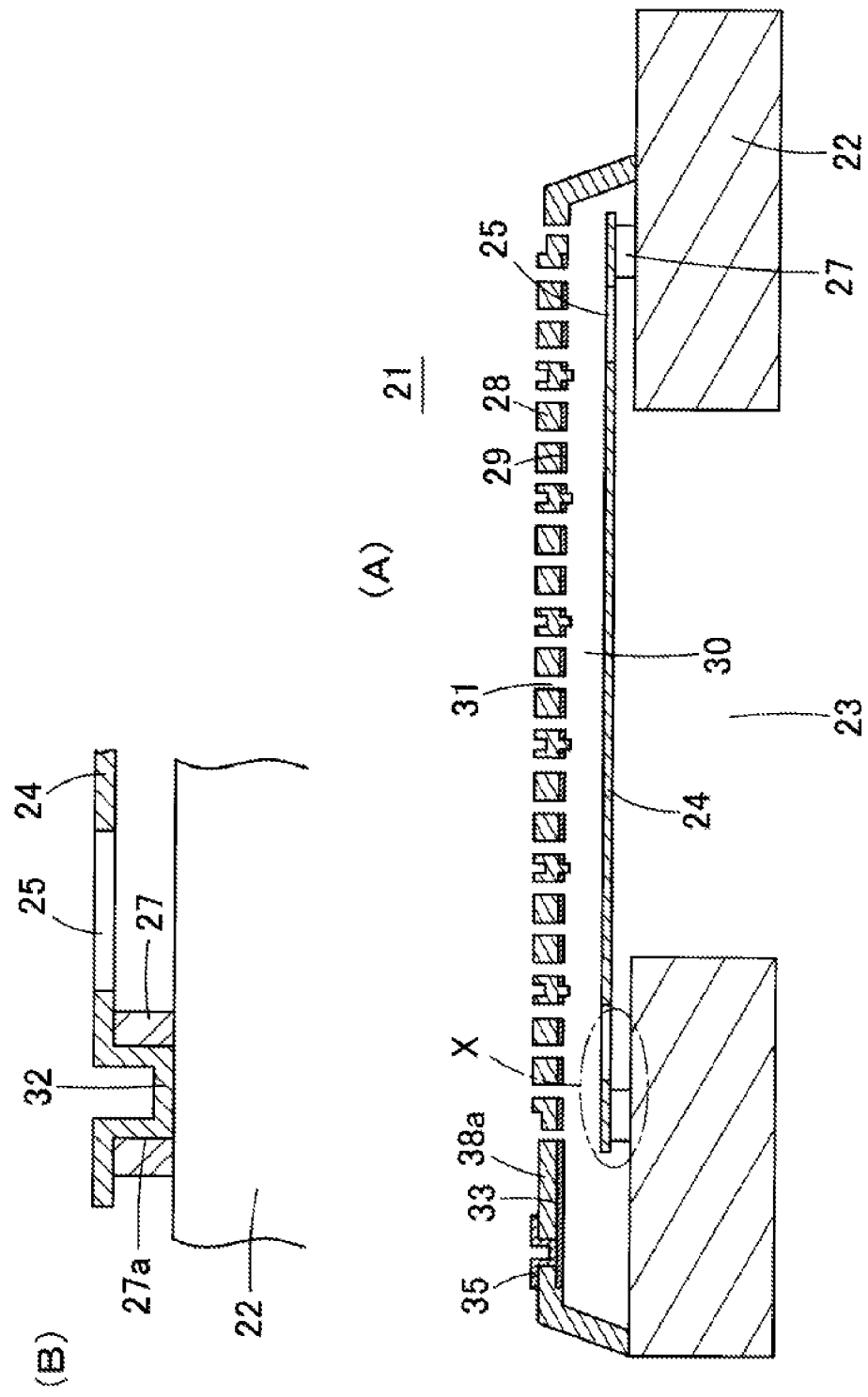
FIG. 5(A) is an enlarged cross-sectional view of the acoustic sensor shown in FIG. 4(A).
FIG. 5(B) is an enlarged view of the cross-section of a portion X in FIG. 5(A).
Figure 6:
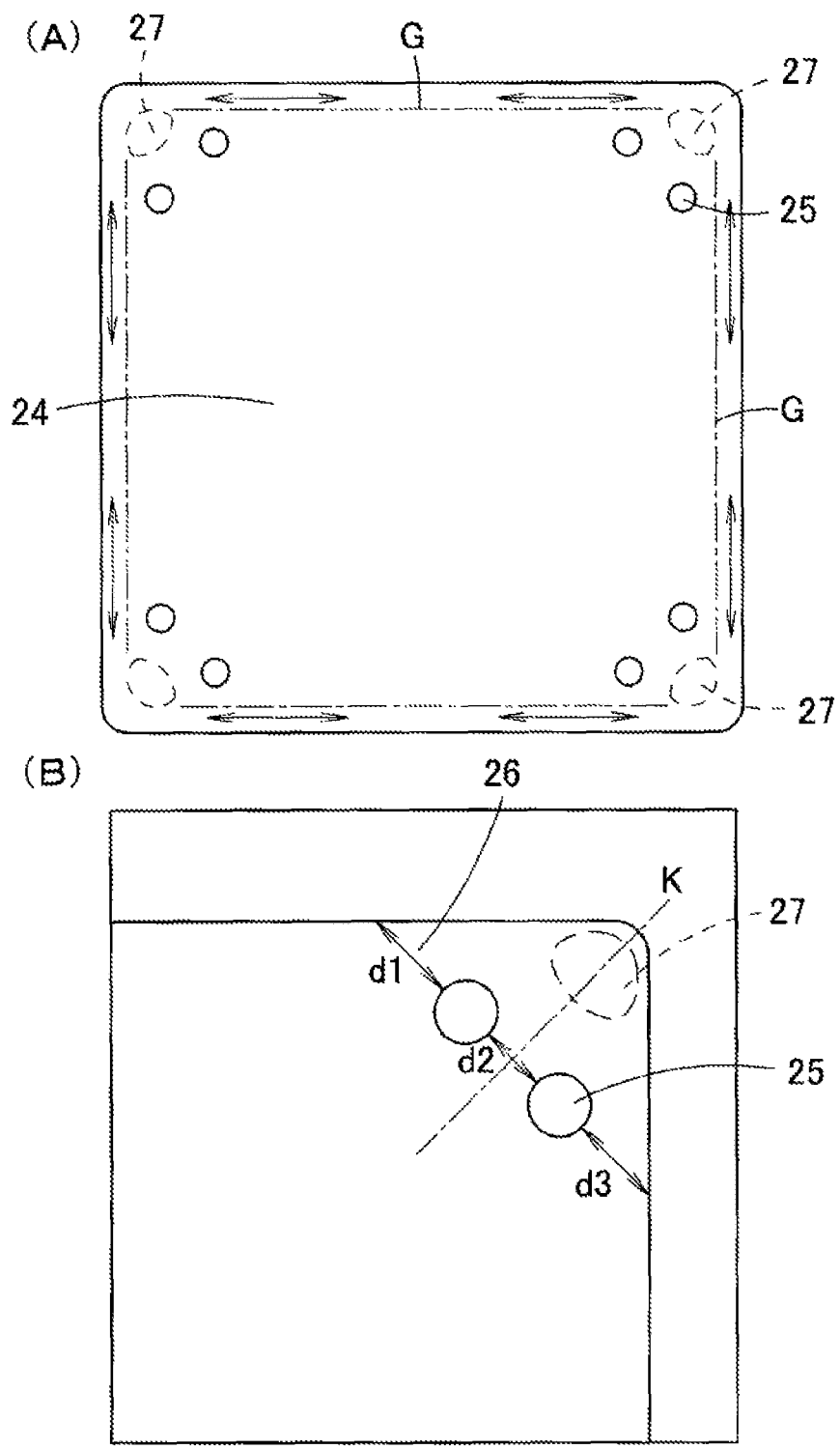
FIG. 6(A) is an enlarged view of the diaphragm of Embodiment 1.
FIG. 6(B) is an enlarged view of a corner portion of the diaphragm.

Hereinafter, a capacitive sensor according to Embodiment 1 of the present invention, that is to say an acoustic sensor 21, will be described with reference to FIGS. 4 to 6. FIG. 4(A) is a plan view of the acoustic sensor 21 according to Embodiment 1 of the present invention. FIG. 4(B) is a plan view of the acoustic sensor 21 in FIG. 4(A), in a state in which a back plate 28 and a fixed electrode plate 29 have been removed to expose a diaphragm 24. FIG. 5(A) is a cross-sectional diagram of the acoustic sensor 21. FIG. 5(B) is an enlarged cross-sectional view of a portion X in FIG. 5(A). FIG. 6(A) is an enlarged view of the diaphragm of Embodiment 1, and FIG. 6(B) is an enlarged view of a corner portion of the diaphragm.

This acoustic sensor 21 is a capacitive element manufactured using MEMS technology. As shown in FIG. 5(A), this acoustic sensor 21 includes a diaphragm 24 provided on the upper surface of a silicon substrate 22 (substrate) via anchors 27, and a fixed electrode plate 29 provided above the diaphragm 24 in opposition to the diaphragm 24.

A chamber 23 (cavity) that penetrates from the upper surface to the lower surface is formed in the silicon substrate 22. The diaphragm 24 is arranged on the upper surface of the silicon substrate 22 so as to cover the upper opening of the chamber 23. The diaphragm 24 is formed by an electrically conductive polysilicon thin film and has an approximately rectangular shape, and the diaphragm 24 itself is a vibrating electrode plate.

As shown in FIG. 4(B), four anchors 27 are arranged on the upper surface of the silicon substrate 22 outward of the chamber 23. The anchors 27 are located in approximately diagonal directions of the diaphragm 24. The lower surfaces of corner portions of the diaphragm 24, which are at places in the vicinity of the outer periphery, are supported by the anchors 27, which are made of an insulating material. In this way, the diaphragm 24 is arranged so as to cover the upper opening of the chamber 23, and floats above the upper opening of the chamber 23 and the upper surface of the silicon substrate 22.

Also, multiple comparatively small through-holes 25 are formed in the diaphragm 24 at locations that are in the vicinity of the places supported by the anchors 27 and are on the central side relative to the places supported by the anchors 27. If the through-holes 25 are overlapped with the chamber 23, the acoustic resistance (vent hole resistance) between the diaphragm 24 and the upper surface of the substrate is too small, and sensitivity to low-pitch sound decreases (rolls off), and therefore the through-holes 25 are provided at positions that are not overlapped with the chamber 23. The through-holes 25 vertically penetrate the diaphragm 24. As shown in FIG. 6(B), multiple through-holes 25 are aligned in a direction orthogonal to a line segment K that connects the center of the anchor 27 and the center of the diaphragm 24. They may be aligned on a straight line that is orthogonal to the line segment K, or may be aligned on a curving curved line. Also, it is desirable that multiple through-holes 25 are arranged symmetrically with respect to the line segment K.

At least one of the anchors 27 has a through-hole 27a as shown in FIG. 5(B), and a portion of the diaphragm 24 forms a through-hole portion 32 (conductive portion) that is embedded inside the through-hole 27a and is in contact with the upper surface of the silicon substrate 22. Because the silicon substrate 22 is electrically conductive, the diaphragm 24 conducts electricity to the silicon substrate 22 through this through-hole structure. Also, as shown in FIG. 4(A), an electrode pad 34 is provided on the upper surface of the silicon substrate 22, and the diaphragm 24 conducts electricity to the electrode pad 34 through the silicon substrate 22. According to this structure, there is no need to draw a lead-out interconnect from the diaphragm 24, which contributes to a reduction in the size of the acoustic sensor 21.

As shown in FIG. 5(A), a fixed electrode plate 29 made of polysilicon is provided on the lower surface of the back plate 28, which is made of SiN. The back plate 28 is formed with a dome shape and has a cavity portion underneath the dome, and the diaphragm 24 is covered by the cavity portion. A very small air gap 30 (air gap) is formed between the lower surface of the fixed electrode plate 29 and the upper surface of the diaphragm 24. As shown in FIGS. 4(A) and 5(A), a bulge portion 28a protrudes from a portion of the back plate 28, in a direction toward the outer periphery of the upper surface of the silicon substrate 22. A lead-out interconnect 33 is drawn out from the fixed electrode plate 29 along the lower surface of the bulge portion 28a. An electrode pad 35 provided on the upper surface of the bulge portion 28a is connected to the tip of the lead-out interconnect 33. Accordingly, the fixed electrode plate 29 conducts electricity to the electrode pad 35.

Many acoustic holes 31 (acoustic holes) for allowing the passage of acoustic vibration are formed in the back plate 28 and the fixed electrode plate 29 so as to penetrate from the upper surface to the lower surface. As shown in FIG. 4(A), the acoustic holes 31 are arranged regularly. In the illustrated example, the acoustic holes 31 are arranged in a triangular manner along three directions that form 60° angles with each other, but they may be arranged in a rectangular manner or a concentric circle manner.

In the acoustic sensor 21, the fixed electrode plate 29 and the diaphragm 24 oppose each other via the air gap 30 so as to constitute a capacitor structure. When the diaphragm 24 vibrates in response to acoustic vibration, the capacitance between the fixed electrode plate 29 and the diaphragm 24 changes, and the acoustic vibration is converted into an electrical signal through this change in the capacitance.

Figure 2:
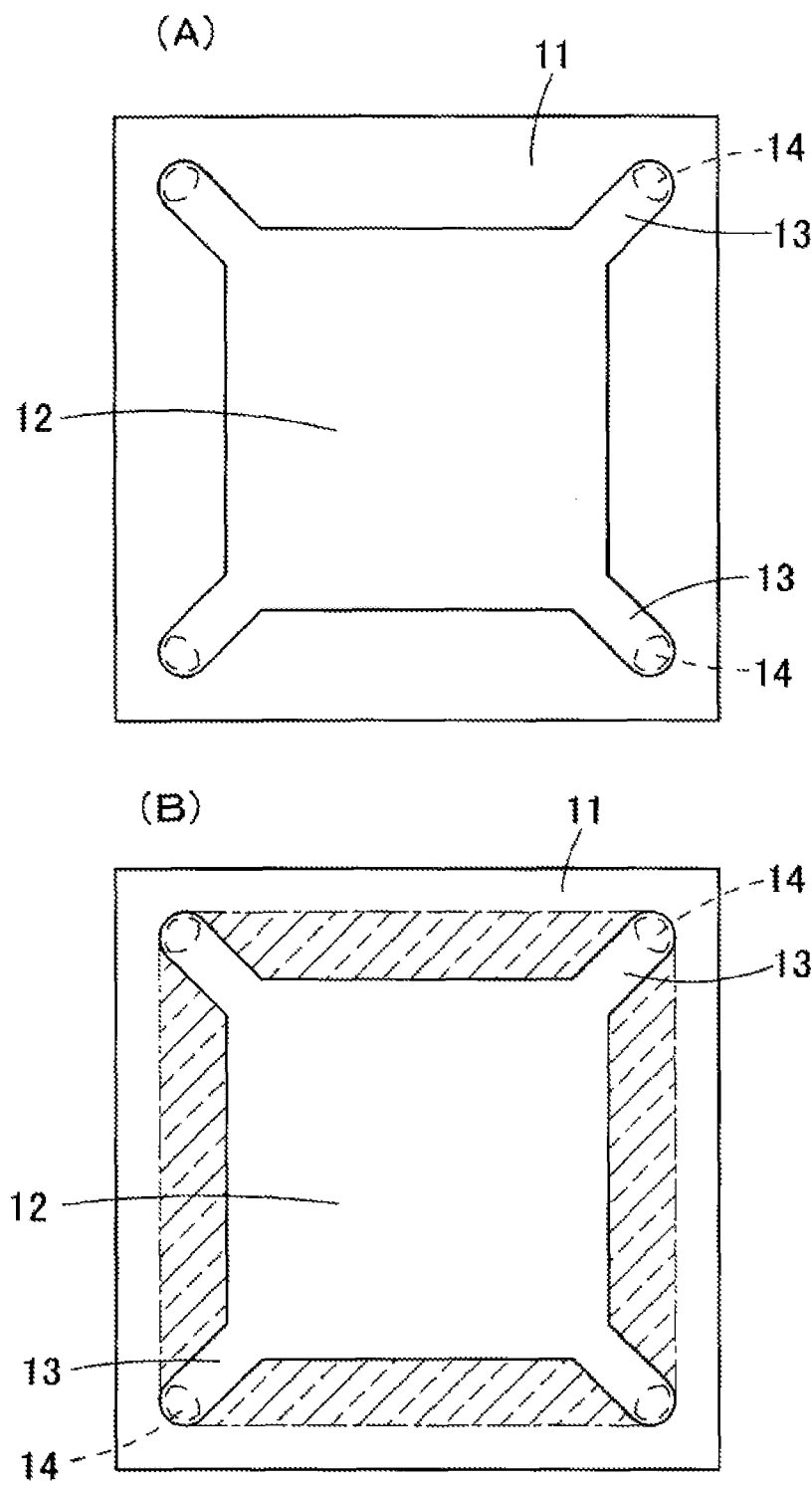
FIG. 2(A) is a plan view of a conventional acoustic sensor that has leg pieces, in a state in which a back plate and a fixed electrode plate have been removed.
FIG. 2(B) is a diagram showing a wasted region in the acoustic sensor in FIG. 2(A).

In this acoustic sensor 21, as shown in FIG. 6(A), in a view from a direction perpendicular to the upper surface of the silicon substrate 22, the entire length of the outer edge of the diaphragm located between adjacent anchors 27 is located outward of a tangent G that circumscribes the edges of the adjacent anchors 27 on the side distant from the center of the diaphragm 24. In other words, the outer edge of the diaphragm 24 is not inward of the tangent G, and does not intersect the tangent G. Note that closed openings such as the through-holes 25 and slits 42 may abut the tangent G or intersect the tangent G. In particular, in the illustrated example, the diaphragm 24 has a structure not having leg pieces. For this reason, in the case of providing the diaphragm on the upper surface of a substrate of the same size, in comparison to the diaphragm 12 that has leg pieces 13 as in FIG. 2(A), it is possible to increase the area of the diaphragm 24, and it is possible to improve the sensitivity of the acoustic sensor 21. Alternatively, in the case where the area of the diaphragm is the same, the substrate size (sensor size) increases in the case of the diaphragm 12 shown in FIG. 2(A) because the leg pieces 13 extend outward, whereas the substrate size does not increase in the case of the acoustic sensor 21 of the present embodiment because it does not have the leg pieces.

Also, when the diaphragm 24 vibrates and undergoes deformation, leg-piece-equivalent portions 26 in the vicinity of the portions fixed by the anchors 27 undergo a large amount of deformation. In this acoustic sensor 21, multiple through-holes 25 are provided in the vicinity of the anchors 27, thus making it possible to reduce the rigidity of the leg-piece-equivalent portions 26 in the vicinity of the anchors 27. In other words, because multiple through-holes 25 are provided in each portion 26, the substantive width of the leg-piece-equivalent portion 26 is the sum of widths d1, d2, and d3 shown in FIG. 6(B), and this is similar to providing a thin leg piece in the corner portion of the diaphragm 24. As a result, the rigidity of the leg-piece-equivalent portion 26 decreases. Consequently, the diaphragm 24 easily undergoes vibration, and the amount of the deformation of the diaphragm 24 increases, and therefore the sensitivity of the acoustic sensor 21 improves further.

Figure 3:
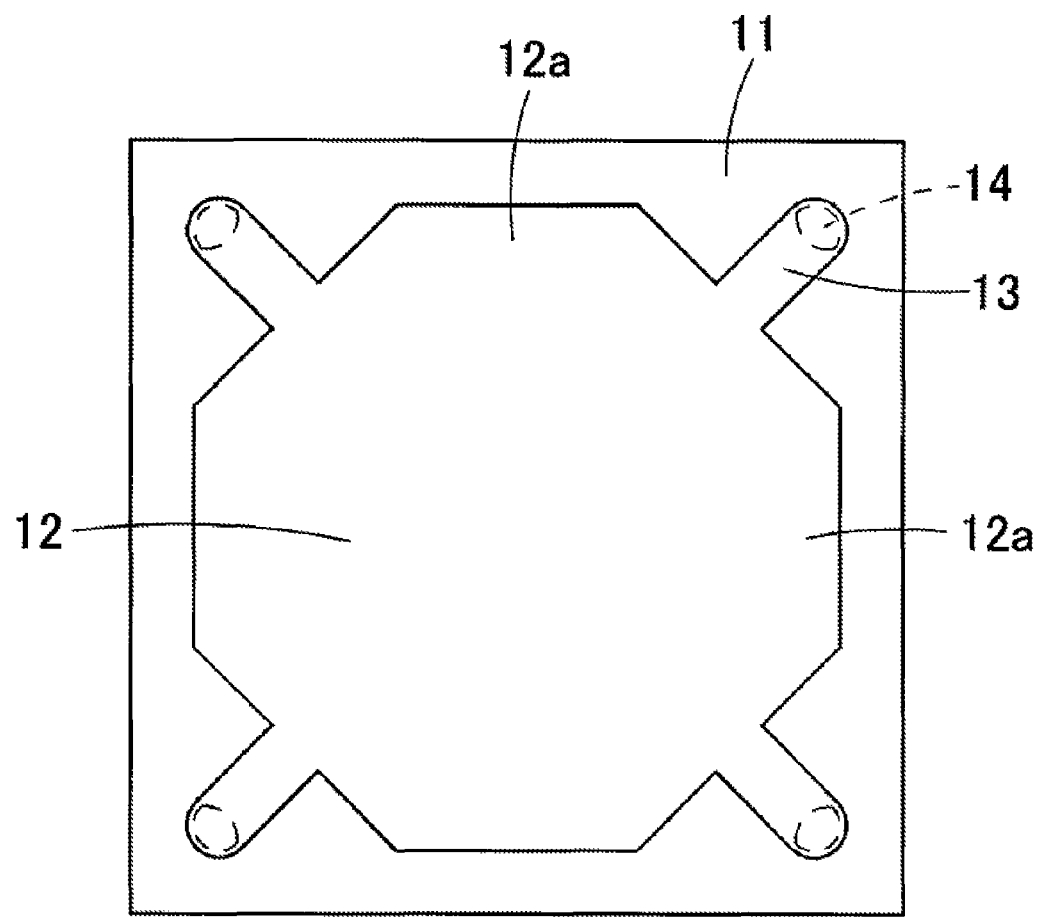
FIG. 3 is a plan view showing a comparison example in which the area of the diaphragm in FIG. 2(A) has been increased.

Also, in this acoustic sensor 21, the entire length of the outer edge of the diaphragm 24 located between anchors 27 is located outward of the tangent G that circumscribes the edges of the anchors 27, and therefore the region of the diaphragm 24 between one anchor 27 and another anchor 27 is supported by the anchors up to the outward edge, rather than being in a cantilevered state as with the extension portion 12a of the diaphragm 12 in FIG. 3. For this reason, the region of the diaphragm 24 between one anchor 27 and another anchor 27 is pulled taut by tensile force from the anchors 27 (tensile force in the directions indicated by arrows in FIG. 6(A)), and warping and distortion do not easily occur.

Furthermore, in this embodiment, multiple through-holes 25 are aligned on a straight line that is orthogonal to the line segment K, and therefore it is possible to efficiently reduce the width d1+d2+d3 of the leg-piece-equivalent portion 26 while also suppressing a reduction in the area of the diaphragm due to the through-holes 25.

Therefore, according to the acoustic sensor 21 of the present embodiment, it is possible to increase the area of the diaphragm by effectively utilizing the diaphragm installation space on the substrate upper surface, and it is possible to improve the sensitivity while also achieving a reduction in the sensor size.

Modified Example

Figure 7:
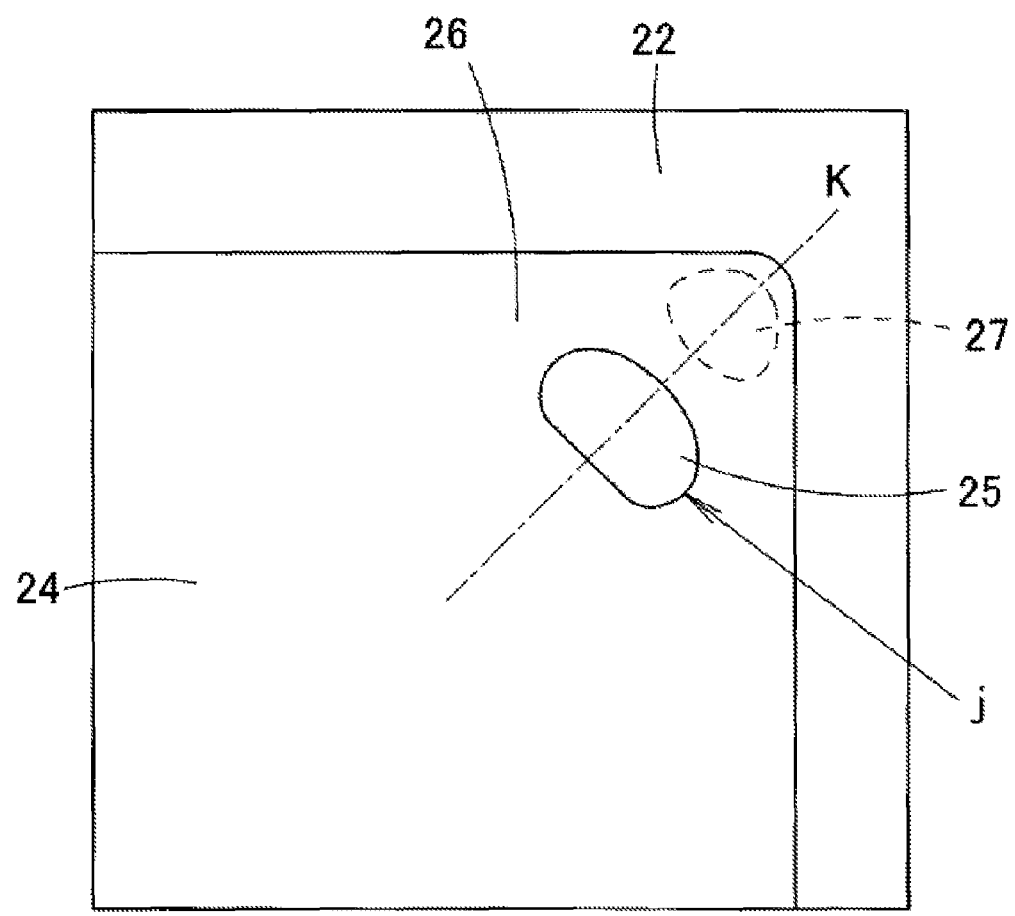
FIG. 7 is an enlarged view of a corner portion of the diaphragm in Embodiment 1 of the present invention.

Although multiple through-holes 25 are provided in Embodiment 1, one through-hole 25 may be provided as shown in FIG. 7. In the case of one through-hole 25, it is preferable that the through-hole 25 is elongated in the direction orthogonal to the line segment K that connects the center of the anchor 27 and the center of the diaphragm 24. If the through-hole 5 is elongated in the direction orthogonal to the line segment K, the width of the leg-piece-equivalent portion 26 can be reduced in comparison with a circular through-hole that has the same opening area, and it is possible to increase the amount of deformation when the diaphragm 24 vibrates.

Also, in order to prevent stress from being generated unevenly in the leg-piece-equivalent portions 26 on the two sides of the through-hole 25, it is desirable that this through-hole 25 has a shape that is symmetrical with respect to the line segment K.

Also, when the diaphragm 24 undergoes deformation, stress easily becomes concentrated in the portion of the outer peripheral edge of the through-hole 25 that has the longest perpendicular distance from the line segment K that connects the center of the anchor 27 and the center of the diaphragm 24. Accordingly, it is not preferable for the edge of the through-hole 25 in this portion to have a bent angle. It is desirable that the concentration of stress is alleviated by curving the portion of the edge of the through-hole 25 that has the longest perpendicular distance from the line segment K so as to be rounded.

Embodiment 2

Figure 8:
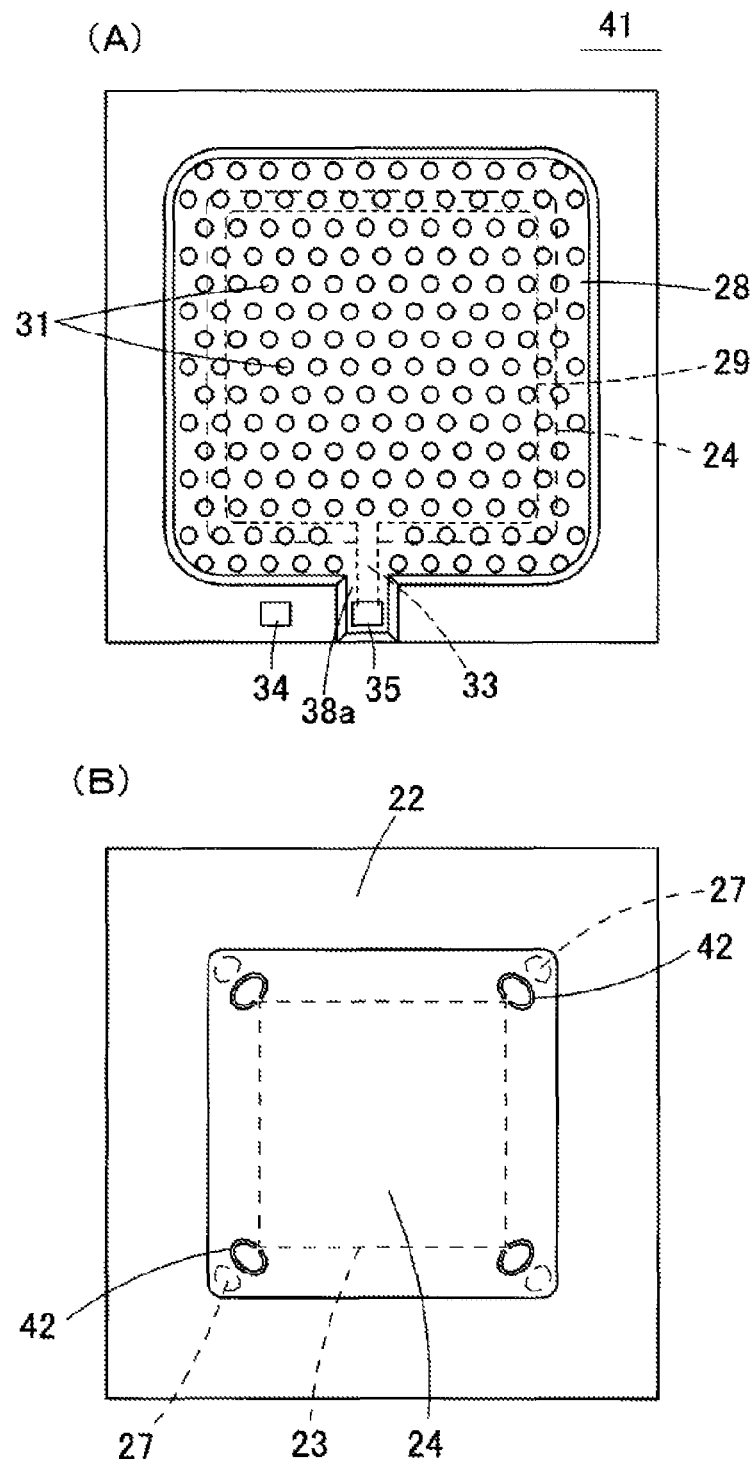
FIG. 8(A) is a plan view showing an acoustic sensor according to Embodiment 2 of the present invention.
FIG. 8(B) is a plan view showing the acoustic sensor shown in FIG. 8(A), in a state in which a back plate and a fixed electrode plate have been removed to expose a diaphragm.
Figure 9:
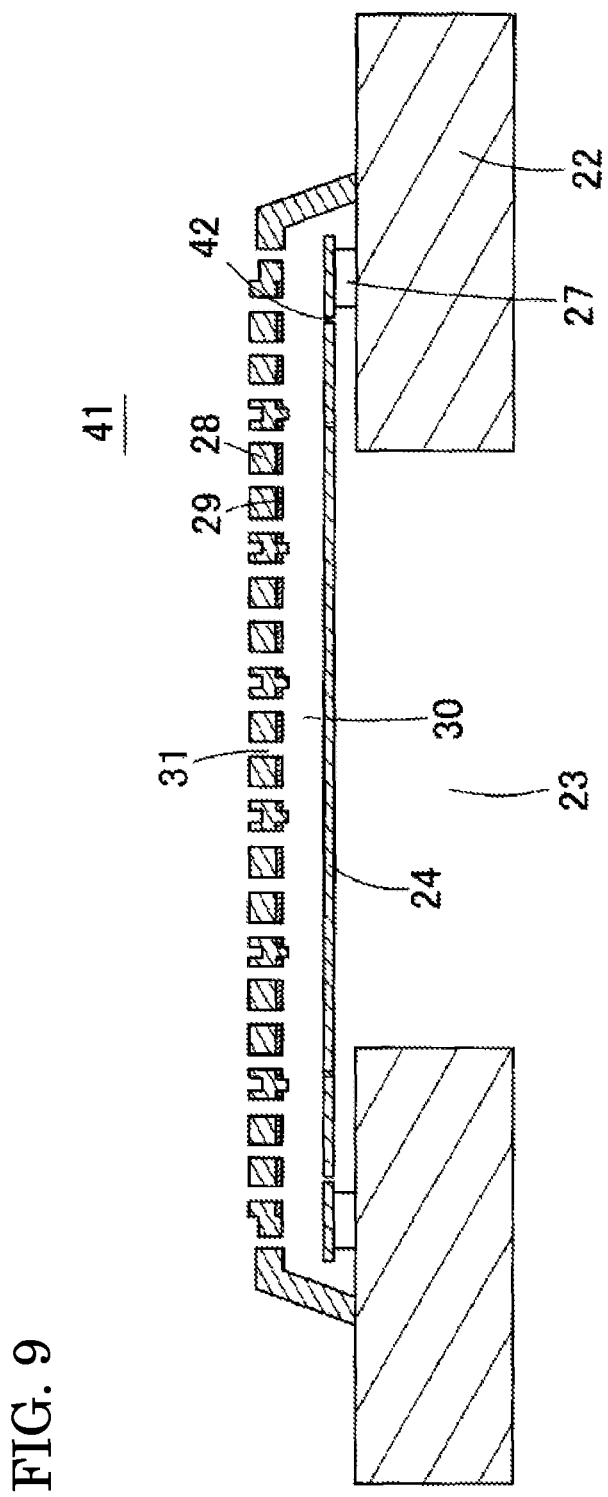
FIG. 9 is a cross-sectional diagram of the acoustic sensor of Embodiment 2.
Figure 10:
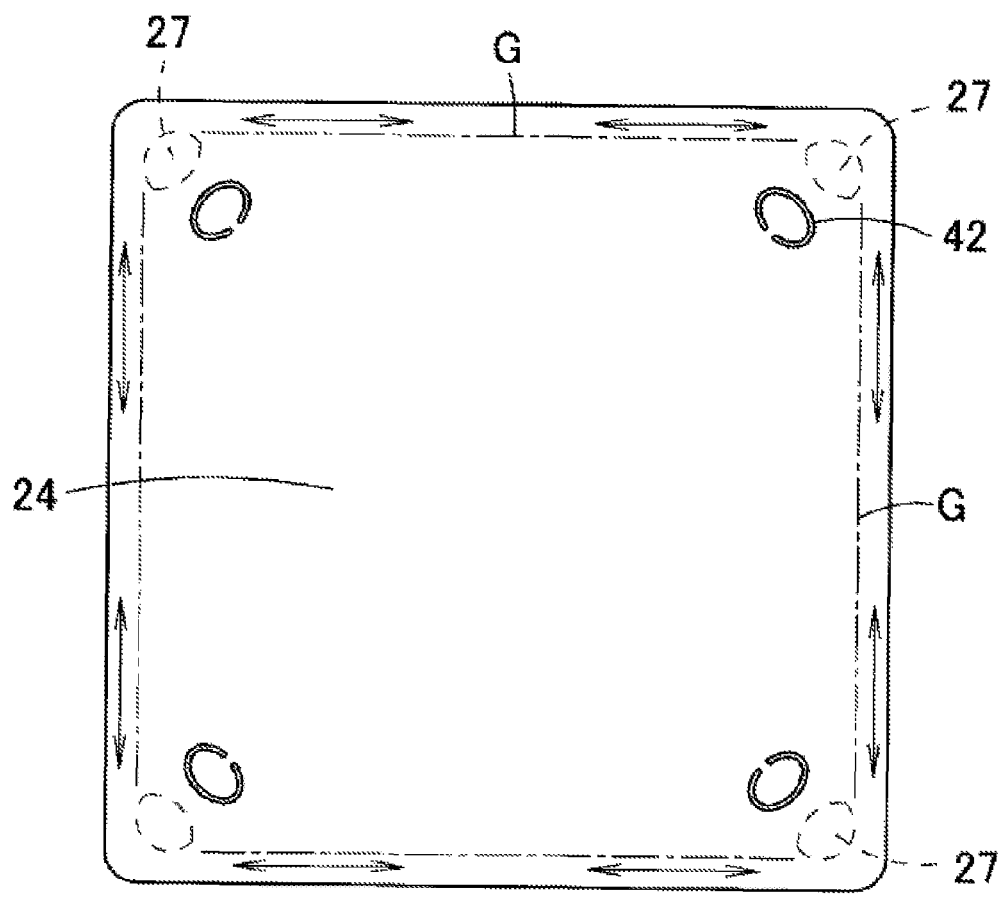
FIG. 10 is an enlarged view of the diaphragm of Embodiment 2.
Figure 11:
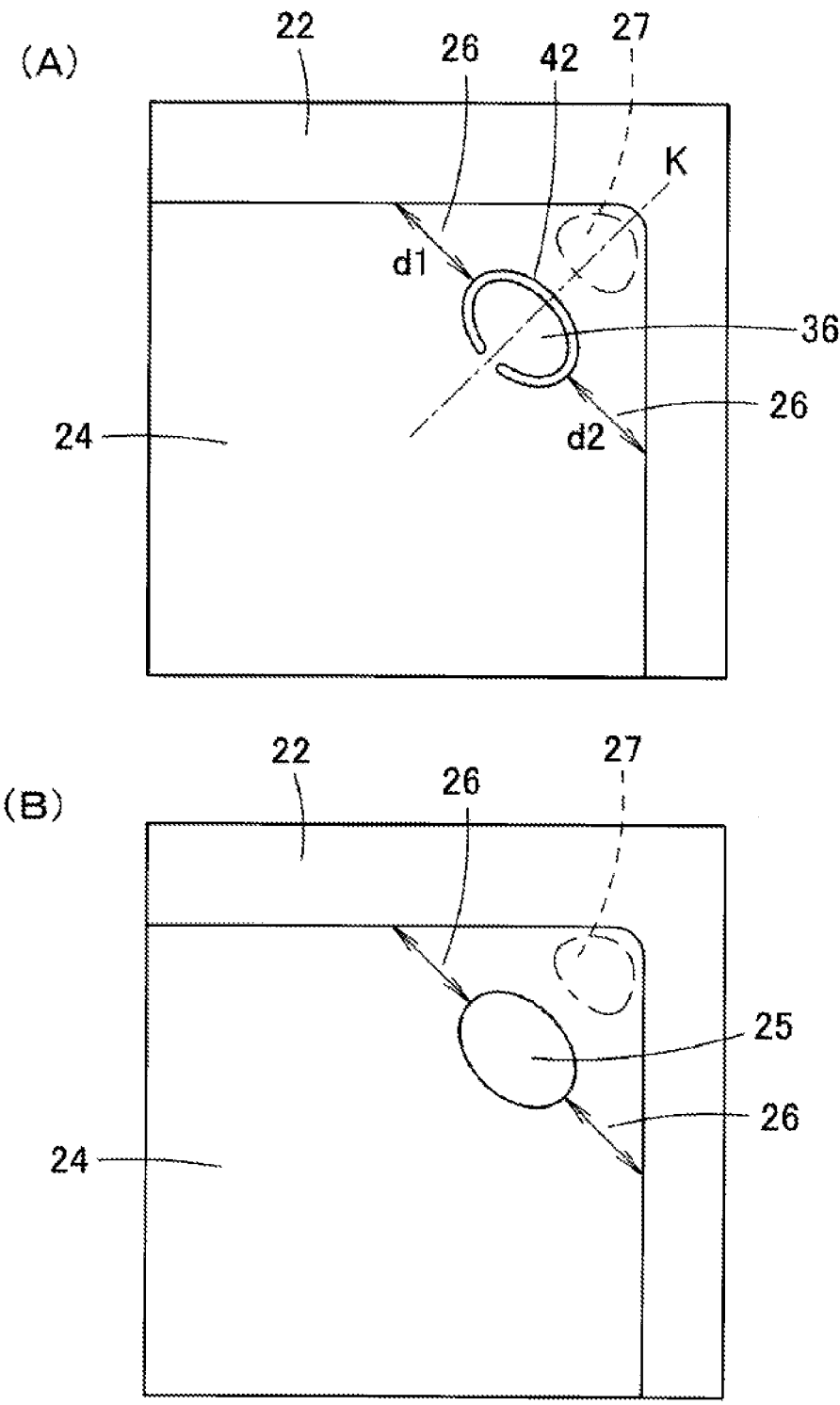
FIG. 11(A) is an enlarged plan view of a corner portion of the diaphragm of Embodiment 2.
FIG. 11(B) is an enlarged view of a corner portion of a diaphragm in a comparison example.

FIG. 8(A) is a plan view showing an acoustic sensor 41 according to Embodiment 2 of the present invention. FIG. 8(B) is a plan view of the acoustic sensor 41 in FIG. 8(A), in a state in which the back plate 28 and the fixed electrode plate 29 have been removed to expose the diaphragm 24. FIG. 9 is a cross-sectional diagram of the acoustic sensor 41 of Embodiment 2. FIG. 10 is a diagram showing an enlargement of the diaphragm 24 of the acoustic sensor 41. FIG. 11(A) is a diagram showing an enlargement of a corner portion of the diaphragm. FIG. 11(B) shows a through-hole 25 of the same size as a slit in FIG. 11(A).

In the acoustic sensor 41 of Embodiment 2, slits 42 are provided instead of the through-holes 25 of Embodiment 1. Aspects other than the portion regarding the slit 42 are similar to the case of Embodiment 1 unless particularly stated below. Accordingly, portions having the same configuration as in Embodiment 1 are denoted by the same reference numbers in the drawings, and descriptions will not be given for them (the same follows for Embodiment 3 and the embodiments thereafter).

As shown in FIGS. 8(B) and 11(A), in the acoustic sensor 41 of Embodiment 2, slits 42 are provided in the diaphragm 24 at locations that are in the vicinity of the places supported by the anchors 27 and are on the central side relative to the places supported by the anchors 27. The slits 42 are shaped as open rings, that is to say are approximately C-shaped, and vertically penetrate the diaphragm 24. The slits 42 are interrupted at the edge on the central side of the diaphragm 24, and portions 36 surrounded by the slits 42 are continuous with the region outside the slits 42 at the edge on the central side of the diaphragm 24. If the slits 42 are overlapped with the chamber 23, the vent hole resistance is too small, and sensitivity to low-pitch sound decreases (rolls off), and therefore the slits 42 are provided at positions that are not overlapped with the chamber 23.

In the case of the slits 42 as well, as shown in FIG. 10, in a view from a direction perpendicular to the upper surface of the silicon substrate 22, the entire length of the outer edge of the diaphragm located between adjacent anchors 27 is located outward of the tangent G that circumscribes the edges of the adjacent anchors 27 on the side distant from the center of the diaphragm 24. In particular, in the illustrated example, the diaphragm 24 has a structure not having leg pieces. For this reason, in the case of providing the diaphragm on the upper surface of a substrate of the same size, in comparison to the diaphragm 12 that has leg pieces 13 as in FIG. 2(A), it is possible to increase the area of the diaphragm 24, and it is possible to improve the sensitivity of the acoustic sensor 41. Alternatively, in the case where the area of the diaphragm is the same, the substrate size (sensor size) increases in the case of the diaphragm 12 shown in FIG. 2(A) because the leg pieces 13 extend outward, whereas the substrate size does not increase in the case of the acoustic sensor 41 of the present embodiment because it does not have the leg pieces.

Also, in this acoustic sensor 41 in FIG. 11(A), the slits 42 are provided in the vicinity of the anchors 27, thus making it possible to reduce the rigidity of the leg-piece-equivalent portions 26 in the vicinity of the anchors 27. In the case of the slits 42, portions of the diaphragm 24 exist inside the slits 42 as well. However, the portions 36 of the diaphragm 24 that are surrounded by the slits 42 do not have the function of transmitting tensile force from the anchors 27 to the central portion of the diaphragm 24 (do not contribute to the rigidity of the leg-piece-equivalent portions 26). Accordingly, in terms of supporting the diaphragm 24, the functionality of the slit 42 in FIG. 11(A) is the same as the through-hole 25 in FIG. 11(B). Accordingly, the substantive width of the leg-piece-equivalent portion 26 that supports the diaphragm 24 is the sum of the widths d1 and d2 on the two sides of the slit 42 shown in FIG. 11(A), and this is similar to providing a thin leg piece in the corner portion of the diaphragm 24. As a result, the rigidity of the leg-piece-equivalent portion 26 decreases. Consequently, the diaphragm 24 easily undergoes vibration, and the amount of the deformation of the diaphragm 24 increases, and therefore the sensitivity of the acoustic sensor 21 improves further.

Also, in this acoustic sensor 21, the entire length of the outer edge of the diaphragm 24 located between anchors 27 is located outward of the tangent G that circumscribes the edges of the anchors 27, and therefore the region of the diaphragm 24 between one anchor 27 and another anchor 27 is supported by the anchors up to the outward edge, rather than being in a cantilevered state as with the extension portion 12a of the diaphragm 12 in FIG. 3. For this reason, the region of the diaphragm 24 between one anchor 27 and another anchor 27 is pulled taut by tensile force from the anchors 27 (tensile force in the directions indicated by arrows in FIG. 6(A)), and warping and distortion do not easily occur.

Figure 12:
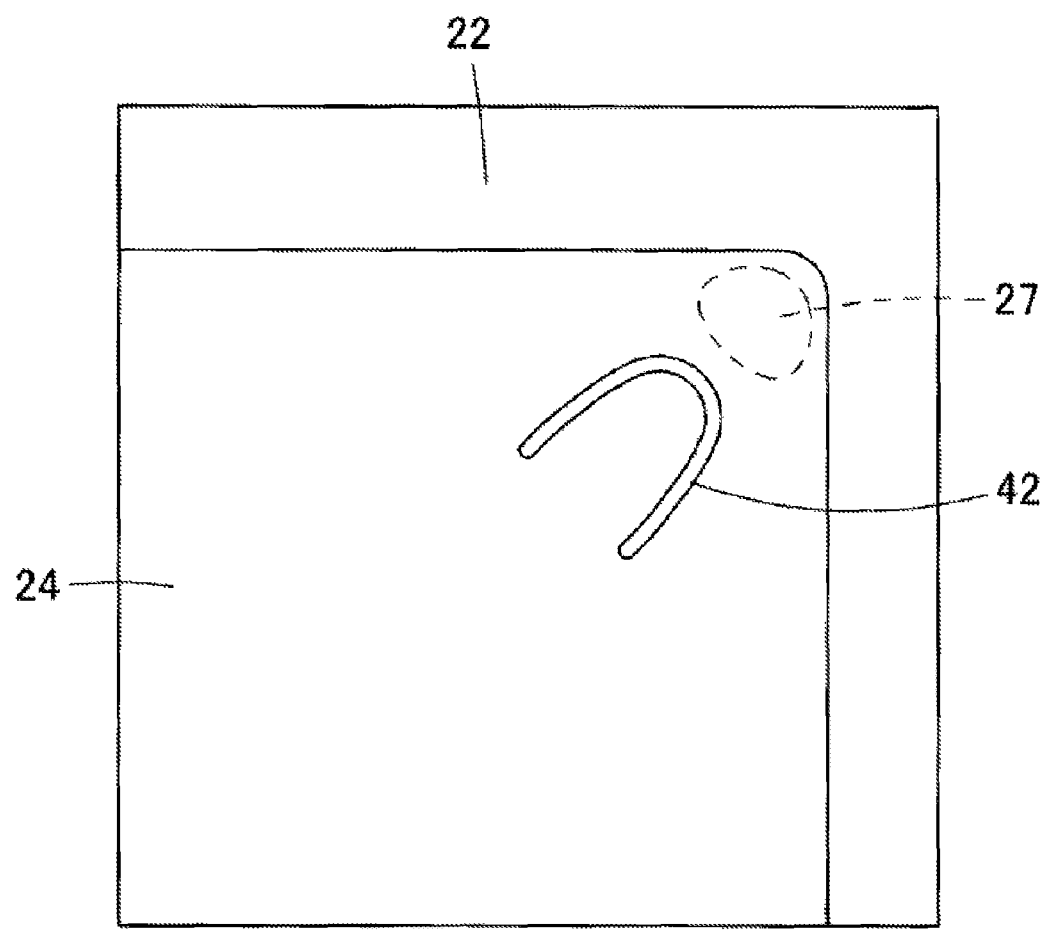
FIG. 12 is a plan view of a modified example of Embodiment 2 of the present invention.

Furthermore, in the case of the slits 42, not only the portion extending in the direction orthogonal to the line segment K, but also the portion extending approximately parallel with the line segment K is important. The slits of the present embodiment have both curved portions that extending in the direction orthogonal to the line segment K and a curved portion that extends approximately parallel with the line segment K, and therefore have an effect of reducing the rigidity of the leg-piece-equivalent portions 26, and can improve the sensitivity of the acoustic sensor 41 by increasing the amount of deformation of the leg-piece-equivalent portions 26. Accordingly, as a modified example of Embodiment 2, the slits may be approximately U-shaped with tips that are separated from each other as shown in FIG. 12.

However, when the diaphragm 24 undergoes deformation, stress easily becomes concentrated in the portion of the outer peripheral edge of the slit 42 that has the longest perpendicular distance from the line segment K that connects the center of the anchor 27 and the center of the diaphragm 24, and therefore it is preferable that this portion is curved so as to be rounded. Accordingly, in the acoustic sensor 41 of Embodiment 2, as shown in FIG. 11(A), the tips of the slit 42 are brought close to each other such that the slit 42 is approximately C-shaped, thus curving the portion that has the longest perpendicular distance from the line segment K.

Also, it is preferable that the open portion of the slit 42 is located on the central side of the diaphragm 24 as in FIG. 11(A). In the case where the open portion of the slit 42 faces the outer peripheral side of the diaphragm 24, even if the diaphragm 24 vibrates and undergoes displacement, the portion 36 surrounded by the slit 42 does not undergo displacement and does not contribute to the sensitivity of the acoustic sensor 41. In contrast, in the case where the open portion of the slit 42 faces the central side of the diaphragm 24, when the diaphragm 24 vibrates and undergoes displacement, the portion 36 surrounded by the slit 42 also undergoes displacement and contributes to a change in the capacitance. Accordingly, the sensitivity of the acoustic sensor 41 can be improved by causing the open portion of the slit 42 to face the central side of the diaphragm 24. Also, a reduction in sensitivity to low-pitch sound can be prevented by positioning the slit 42 so as to be distant from the chamber 23, and therefore compared to causing the open portion of the slit 42 to face the outer side of the diaphragm 24, causing it to face the central side of the diaphragm 24 makes it possible to prevent a reduction in sensitivity to low-pitch sound.

Also, in the Embodiment 2, the interior of the slit 42 is blocked by the portion 36 of the diaphragm 24, and therefore it is possible to prevent a reduction in sensitivity to low frequency sound by providing openings in the diaphragm 24.

Therefore, according to the acoustic sensor 41 of Embodiment 2, it is possible to increase the area of the diaphragm by effectively utilizing the diaphragm installation space on the substrate upper surface, and it is possible to improve the sensitivity while also achieving a reduction in the sensor size.

Note that there is a risk of cracking occurring at the ends of the slits 42 due to vibration of the diaphragm 24. Accordingly, it is preferable that the ends of the slits 42 are rounded so as to be arc-shaped, or terminated with circular holes.

Also, in order to prevent stress from being generated unevenly in the leg-piece-equivalent portions 26 on the two sides of the through-hole 25, it is desirable that this through-hole 25 has a shape that is symmetrical with respect to the line segment K.

Also, it is preferable that the slit 42 is interrupted at one place. This is because if the slit 42 is interrupted at two places, the portion on the outer peripheral side of the slit 42 and the portion inward of the slit 42 are connected via the portion 36 surrounded by the slit 42, and the rigidity of the leg-piece-equivalent portion 26 increases.

Modified Example

Note that although not shown, multiple slits 42 shaped as shown in FIG. 11(A) may be arranged in the vicinity of the anchors 27.

Embodiment 3

FIG. 13(A) is a plan view for describing an acoustic sensor according to Embodiment 3 of the present invention, and shows a state in which the back plate and the fixed electrode plate have been removed to expose the diaphragm 24. Also, FIG. 13(B) is an enlarged diagram showing a corner portion of the diaphragm 24.

As shown in FIG. 13(A), in the diaphragm 24 used in the acoustic sensor of Embodiment 3, slits 42 are provided in the vicinity of the anchors 27 in the corner portions of the diaphragm 24. With the slits 42 of Embodiment 3, as shown in FIG. 13(B), the tip portions of each slit 42 are curled so as to curve inward. Stress concentration easily occurs in the tip portions of the slit 42 when the diaphragm 24 undergoes deformation, and therefore curling these portions so as to be rolled inward makes it possible to increase the strength of the diaphragm 24.

Figure 14:
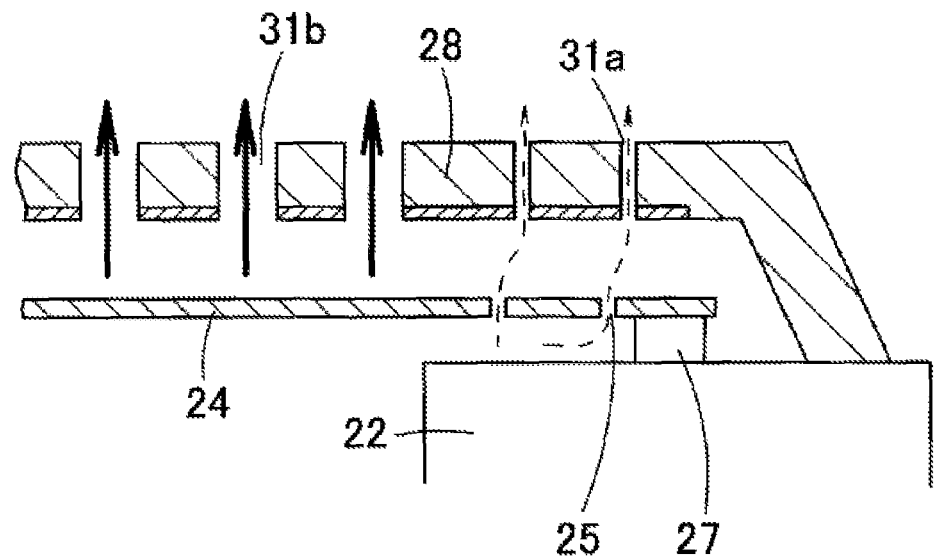
FIG. 14 is a schematic cross-sectional diagram showing the structure of acoustic holes in an acoustic sensor of Embodiment 3.

FIG. 14 is a schematic cross-sectional diagram showing the structure of acoustic holes 31 in all of the acoustic sensors of Embodiments 1 to 3. Acoustic holes 31a located above the slits 42 (The same follows in the case of the through-holes 25 as well.) are given a smaller diameter (opening area) to make the passage of air as difficult as possible. Acoustic holes 31b not located above the slits 42 are given a comparatively larger diameter (opening area) to make the escape of air easy in order to avoid damping of the diaphragm 24. Accordingly, the acoustic holes 31a located above the slits 42 (through-holes 25) are smaller than the other acoustic holes 31b, particularly the acoustic holes 31b located in the central portion of the back plate 28. As shown by dashed-line arrows in FIG. 14, if air from the acoustic holes 31 easily passes through the slits 42, sensitivity in the low-pitch range decreases, and therefore the acoustic holes 31a located above the slits 42 are reduced in size to prevent a reduction in sensitivity in the low-pitch range.

Modified Example

Figure 15:
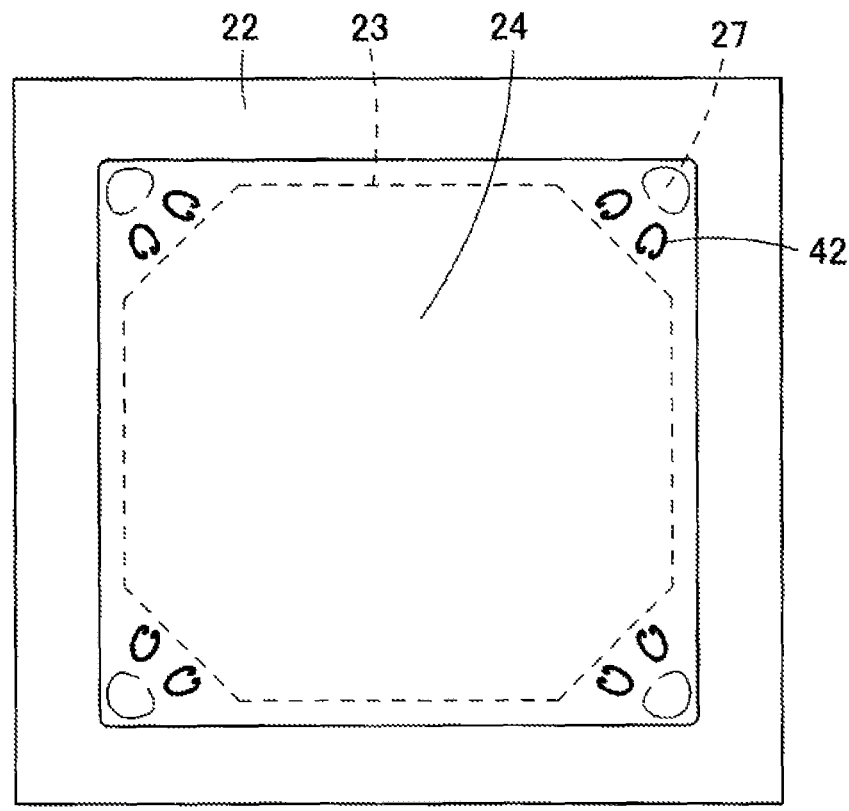
FIG. 15 is a plan view of a diaphragm in a modified example of Embodiment 3.

FIG. 15 is a plan view showing the back plate in a modified example of Embodiment 3 of the present invention. In this modified example, two slits 42 having the shape described in Embodiment 3 are formed in the vicinity of each anchor 27. Also, the chamber 23 may be increased in size by extending the chamber 23 into the region between the slits 42 and the anchors 27 in adjacent corner portions as shown in FIG. 15. If the size of the chamber 23 is increased in this way, the vent hole resistance decreases.

Also, three or more slits 42 may be provided in the vicinity of each anchor 27.

Also, the chamber 23 is not limited to having a rectangular shape, and may have a discoid shape as shown in FIG. 16(A), or may have a polygonal shape as shown in FIG. 16(B).

Embodiment 4

Figure 17:
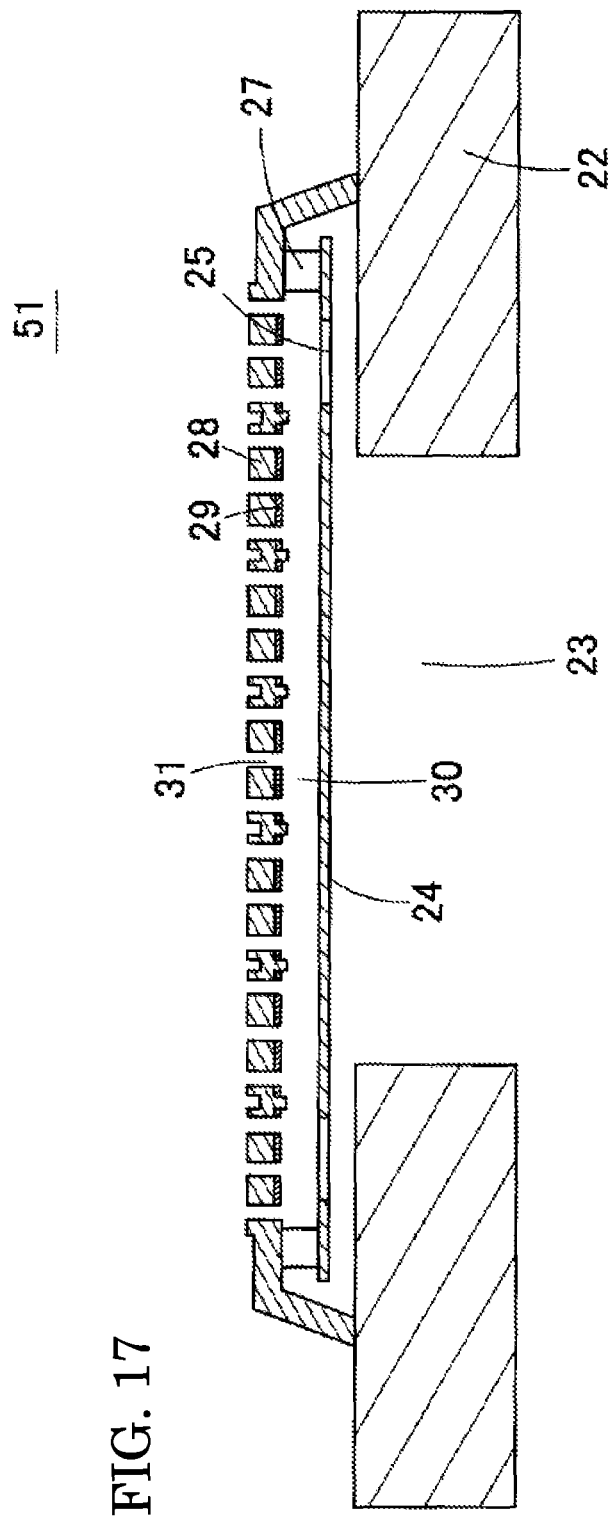
FIG. 17 is a cross-sectional diagram of an acoustic sensor according to Embodiment 4 of the present invention.

FIG. 17 is a cross-sectional view of an acoustic sensor 51 according to Embodiment 4 of the present invention. In this embodiment, the anchors 27 are provided on the lower surface of the back plate 28, and the diaphragm 24 is suspended below the back plate 28 by fixing the upper surface of the diaphragm 24 to the lower surfaces of the anchors 27. In the case where the anchors 27 are provided on the upper surface of the silicon substrate 22, the chamber 23 cannot be formed at the positions of the anchors 27, and the size and shape of the chamber 23 are constrained by the anchors 27. In contrast, in the case of Embodiment 4, the location, size, and shape of the chamber 23 can be determined without being constrained by the positions of the anchors 27. In particular, the chamber 23 can be formed directly below the anchors 27, and thus the degree of freedom in design in the vicinity of the vent hole increases.

Embodiment 5

Figure 18:
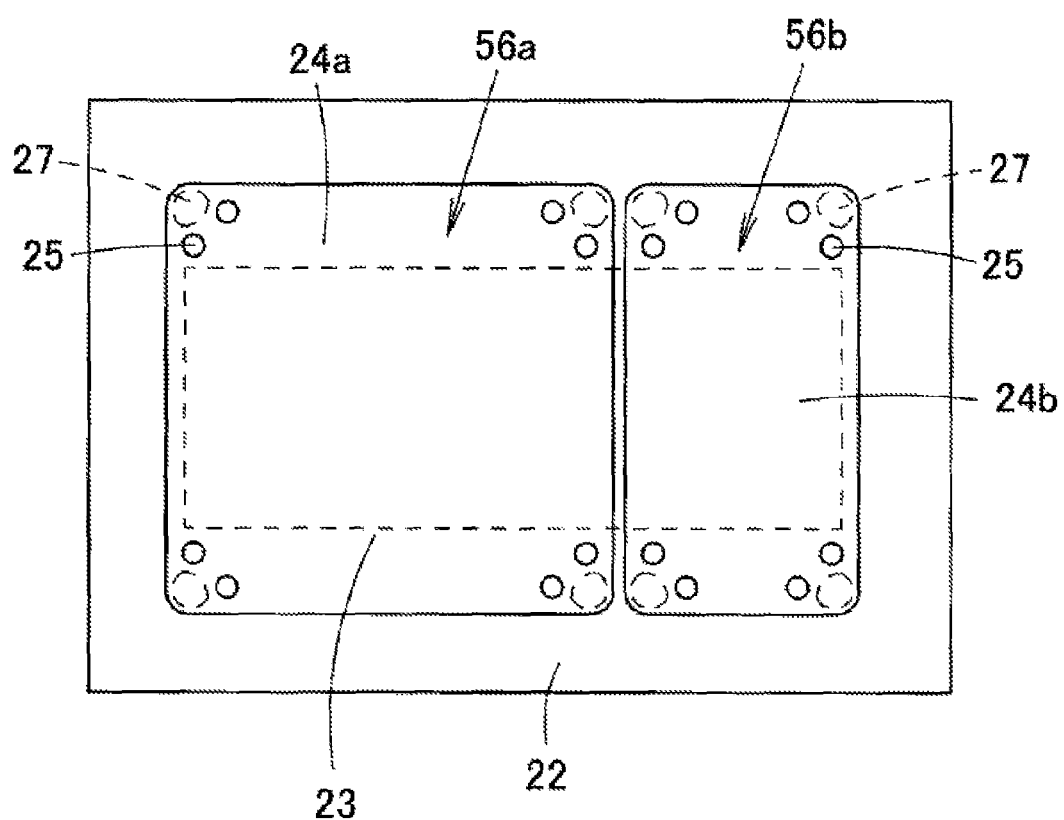
FIG. 18 is a plan view of a diaphragm in Embodiment 5 of the present invention.

FIG. 18 is a plan view showing Embodiment 5 of the present invention. In Embodiment 5, two diaphragms 24a and 24b are formed above the chamber 23 formed in the silicon substrate 22. The lower surfaces of the corner portions of each of the diaphragms 24a and 24b are supported by the anchors 27, and slits 42 (or through-holes 25) are formed in the diaphragms 24a and 24b in the vicinity of the anchors 27. Although not shown, one fixed electrode plate 29 opposes the diaphragms 24a and 24b from above (Alternatively, separate fixed electrode plates 29 may respectively oppose the diaphragms 24a and 24b.). Also, a first sensing portion 56a is constituted by the diaphragm 24a and the fixed electrode plate 29, and a second sensing portion 56b is constituted by the diaphragm 24b and the fixed electrode plate 29. Accordingly, if the diaphragms 24a and 24b shown in FIG. 18 are used, it is possible to use two sensing portions to produce an acoustic sensor that has a high S/N ratio, and to produce an acoustic sensor that has a wide dynamic range by changing the areas of the two sensing portions.

If the diaphragms 24a and 24b with the configurations of the present invention are used in this acoustic sensor, leg pieces do not extend from the diaphragms 24a and 24b, and therefore the diaphragm 24a and the diaphragm 24b can be arranged close to each other. For this reason, it is possible to produce an acoustic sensor that is small and has a wide dynamic range.

Embodiment 6

Figure 19:
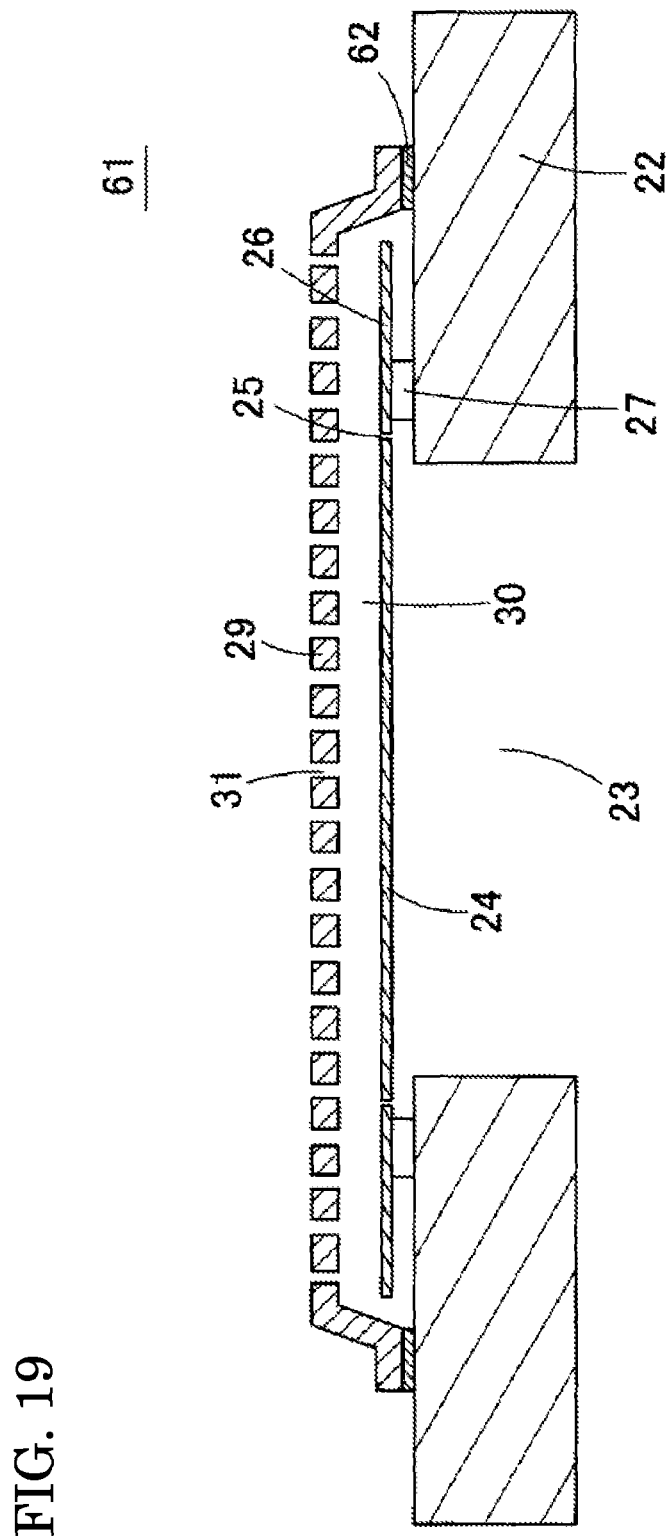
FIG. 19 is a cross-sectional diagram showing an acoustic sensor according to Embodiment 6 of the present invention.

FIG. 19 is a cross-sectional diagram showing an acoustic sensor 61 according to Embodiment 6 of the present invention. In this acoustic sensor 61, the fixed electrode plate 29 is formed with a dome shape and has a thickness sufficient for obtaining necessary rigidity. The fixed electrode plate 29 is provided on the upper surface of the silicon substrate 22 via an insulation layer 62 and covers the diaphragm 24 provided above the silicon substrate 22. A pressure sensor that does not use a back plate may be configured as in this embodiment.

Embodiment 7

Figure 20:
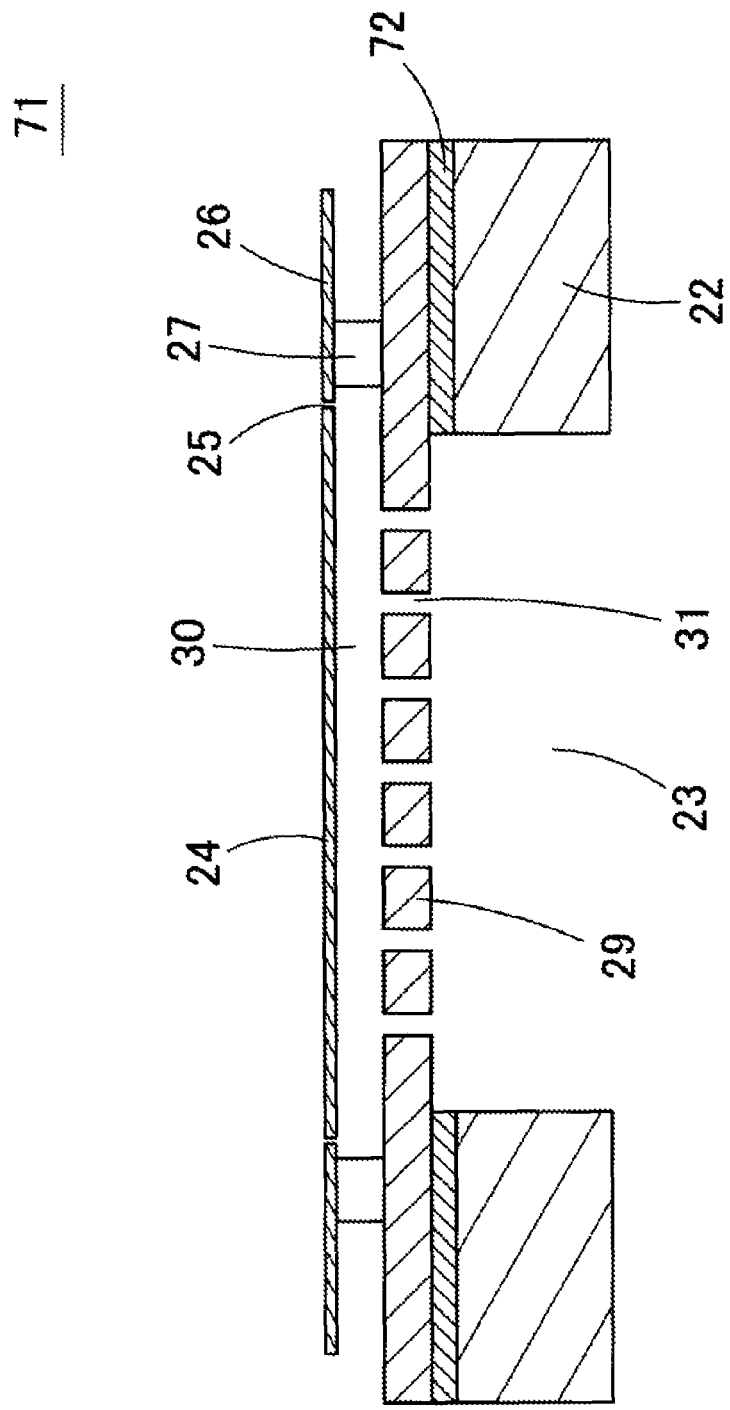
FIG. 20 is a cross-sectional diagram showing an acoustic sensor according to Embodiment 7 of the present invention.

FIG. 20 is a cross-sectional diagram showing an acoustic sensor 71 according to Embodiment 4 of the present invention. In this acoustic sensor 71, a fixed electrode plate 29 having a flat plate shape is provided on the upper surface of the silicon substrate 22 via an insulation layer 72. Furthermore, the diaphragm 24 is arranged above the fixed electrode plate 29 so as to oppose the fixed electrode plate 29. The leg pieces 26 connected to the diaphragm 24 are supported by the anchors 27 provided on the upper surface of the fixed electrode plate 29. Also, above the chamber 23, multiple acoustic holes 31 are formed in the fixed electrode plate 29. A pressure sensor may be configured such that the fixed electrode plate opposes the diaphragm below the diaphragm as in this embodiment.

Application in Microphone

Figure 21:
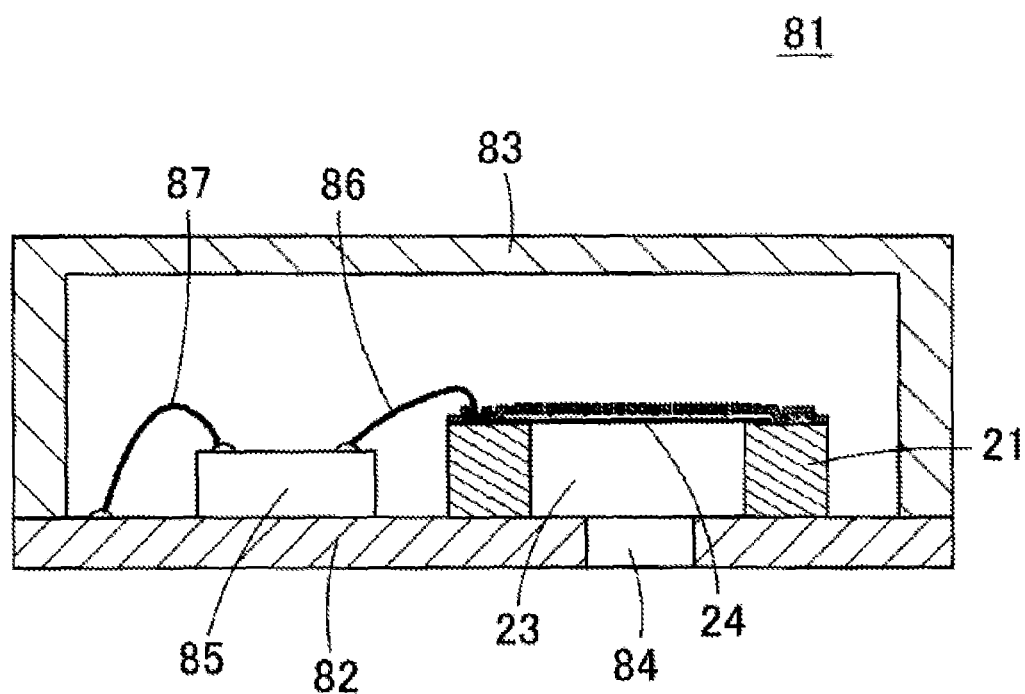
FIG. 21 is a schematic cross-sectional diagram of a microphone having an acoustic sensor according to the present invention built therein.

FIG. 21 is a schematic cross-sectional diagram of a bottom port type of microphone 81 including an acoustic sensor according to the present invention, such as the acoustic sensor 21 of Embodiment 1. This microphone 81 has the acoustic sensor 21 and a signal processing circuit 85 (ASIC), which is a circuit portion, built into a package made up of a circuit substrate 82 and a cover 83. The acoustic sensor 21 and the signal processing circuit 85 are mounted on the upper surface of the circuit substrate 82. A sound introduction hole 84 for the introduction of acoustic vibration into the acoustic sensor 21 is formed in the circuit substrate 82. The acoustic sensor 21 is mounted on the upper surface of the circuit substrate 82 such that the lower opening of the chamber 23 is aligned with the sound introduction hole 84 and covers the sound introduction hole 84. Accordingly, the chamber 23 of the acoustic sensor 21 is the front chamber, and the space inside the package is the back chamber.

The acoustic sensor 21 and the signal processing circuit 85 are connected by a bonding wire 86. Furthermore, the signal processing circuit 85 is connected to the circuit substrate 82 by a bonding wire 87. Note that signal processing circuit 85 has a function of supplying power to the acoustic sensor 21 and a function of outputting a capacitance change signal from the acoustic sensor 21 to the outside.

The cover 83 is attached to the upper surface of the circuit substrate 82 so as to cover the acoustic sensor 21 and the signal processing circuit 85. The package has an electromagnetic shielding function, and protects the acoustic sensor 21 and the signal processing circuit 85 from mechanical shock and electrical disturbances from the outside.

In this way, acoustic vibration that has entered the chamber 23 through the sound introduction hole 84 is detected by the acoustic sensor 21, and then output after being subjected to amplification and signal processing by the signal processing circuit 85. Since the space inside the package is the back chamber in this microphone 81, the volume of the back chamber can be increased, and the sensitivity of the microphone 81 can be increased.

Note that in this microphone 81, the sound introduction hole 84 for introducing acoustic vibration into the package may be formed in the upper surface of the cover 83. In this case, the chamber 23 of the acoustic sensor 21 is the back chamber, and the space inside the package is the front chamber.

The invention claimed is:
1. A capacitive sensor comprising:
    a substrate having a cavity that is open at least at an upper surface;
    a vibrating electrode plate formed above the substrate so as to cover an upper portion of the cavity;

a plurality of anchors that are arranged with a gap in an outer peripheral portion of the vibrating electrode plate and enable the vibrating electrode plate to be fixed to a stationary member; and a fixed electrode plate arranged so as to oppose the vibrating electrode plate, wherein in a view from a direction perpendicular to an upper surface of the substrate, an entire length of an outer edge of the vibrating electrode plate located between adjacent anchors is located outward of a tangent that circumscribes edges of the adjacent anchors on a side distant from a center of the vibrating electrode plate, and one or two or more openings are provided in regions of the vibrating electrode plate that are in a vicinity of the anchors.

2. The capacitive sensor according to claim 1, wherein the openings are provided at positions separated from positions of the anchors by an amount equal to or twice the size of the anchors.

3. The capacitive sensor according to claim 1, wherein the openings are slits or through-holes that vertically penetrate the vibrating electrode plate.

4. The capacitive sensor according to claim 1, wherein a portion of an outer peripheral edge of each of the openings that has a longest perpendicular distance from a line segment that connects an anchor in a vicinity of the opening and a center of the vibrating electrode plate is curved.

5. The capacitive sensor according to claim 3, wherein the openings are slits shaped as an open ring.

6. The capacitive sensor according to claim 5, wherein the slits are interrupted on a central side of the vibrating electrode plate.

7. The capacitive sensor according to claim 5, wherein a gap between ends of each of the slits in an interrupted portion of the slit is smaller than a longest perpendicular distance from a line segment that connects an anchor in a vicinity of the slit and a center of the vibrating electrode plate to an outer peripheral edge of the slit.

8. The capacitive sensor according to claim 5, wherein an end portion of each of the slits is curved toward an interior of a region surrounded by the slit.

9. The capacitive sensor according to claim 5, wherein regions surrounded by the slits are blocked by a portion of the vibrating electrode plate.

10. The capacitive sensor according to claim 1, wherein in the view from the direction perpendicular to the upper surface of the substrate, the opening has a shape symmetrical with respect to a straight line connecting the anchor and a center of the vibrating electrode plate.

11. The capacitive sensor according to claim 1, wherein a plurality of openings provided in a region in a vicinity of one anchor are arranged in a periphery of the one anchor.

12. The capacitive sensor according to claim 1, wherein the openings in the vibrating electrode plate are provided at locations that are not overlapped with the cavity in the view from the direction perpendicular to the upper surface of the substrate.

13. The capacitive sensor according to claim 1,
wherein the stationary member is the substrate, and
the vibrating electrode plate is fixed on the substrate via the anchors.

14. The capacitive sensor according to claim 13, wherein the vibrating electrode plate and the substrate are electrically conductive by a conductive portion that penetrates an interior of an anchor.

15. The capacitive sensor according to claim 1,
wherein a back plate is formed on the substrate so as to cover the vibrating electrode plate,
the stationary member is the back plate, and
the vibrating electrode plate is fixed to a lower surface of the back plate via the anchors.

16. The capacitive sensor according to claim 1,
wherein the stationary member is the fixed electrode plate, and
the vibrating electrode plate is fixed to the fixed electrode plate via the anchors.

17. The capacitive sensor according to claim 1, wherein the vibrating electrode plate is shaped as a rectangle.

18. An acoustic sensor employing the capacitive sensor according to claim 1,
wherein a plurality of acoustic holes for allowing passage of acoustic vibration is formed in the back plate and the fixed electrode plate.

19. The acoustic sensor according to claim 18, wherein the acoustic holes located above the openings have a smaller opening area than the acoustic holes located in a central portion of the back plate.

20. A microphone comprising the acoustic sensor according to claim 18 and a circuit portion that amplifies a signal from the acoustic sensor and outputs the amplified signal to the outside.

* * * * *